United States Patent
Sharon et al.

(10) Patent No.: US 11,170,870 B1
(45) Date of Patent: Nov. 9, 2021

(54) ON-CHIP-COPY FOR INTEGRATED MEMORY ASSEMBLY

(71) Applicant: WESTERN DIGITAL TECHNOLOGIES, INC., San Jose, CA (US)

(72) Inventors: Eran Sharon, Rishon Lezion (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/886,685

(22) Filed: May 28, 2020

(51) Int. Cl.
*G11C 29/00* (2006.01)
*G11C 29/44* (2006.01)
*G11C 29/42* (2006.01)
*G11C 29/12* (2006.01)

(52) U.S. Cl.
CPC ........ *G11C 29/44* (2013.01); *G11C 29/12005* (2013.01); *G11C 29/42* (2013.01); *G11C 29/78* (2013.01); *G11C 2029/1202* (2013.01)

(58) Field of Classification Search
CPC ... G11C 29/44; G11C 29/12005; G11C 29/42; G11C 29/78; G11C 2029/1202
See application file for complete search history.

(56) References Cited

U.S. PATENT DOCUMENTS

| | | | |
|---|---|---|---|
| 5,838,832 A | 11/1998 | Barnsley | |
| 7,226,026 B2 | 9/2007 | Gongwer | |
| 7,409,473 B2 | 8/2008 | Conley | |
| 7,446,575 B2 | 12/2008 | Shalvi | |
| 7,849,381 B2 | 12/2010 | Tomlin | |
| 8,111,548 B2 | 2/2012 | Mokhlesi | |
| 8,144,512 B2 | 3/2012 | Huang | |
| 8,301,912 B2 | 10/2012 | Lin | |
| 8,341,501 B2 | 12/2012 | Franceschini | |
| 8,756,365 B2 | 6/2014 | Sharon | |
| 8,799,559 B2 | 8/2014 | Sharon | |
| 8,874,994 B2 | 10/2014 | Sharon | |
| 9,165,649 B2 | 10/2015 | Sharon | |
| 9,575,683 B2 | 2/2017 | Achtenberg | |
| 10,387,303 B2 | 8/2019 | Mehra | |

(Continued)

OTHER PUBLICATIONS

Schmier, et al., "Non-Volatile Storage System With Reduced Program Transfers," U.S. Appl. No. 16/223,716, filed Dec. 18, 2018.

*Primary Examiner* — Tuan T Nguyen
(74) *Attorney, Agent, or Firm* — Vierra Magen Marcus LLP

(57) ABSTRACT

A non-volatile memory system comprises an integrated memory assembly in communication with a memory controller. The integrated memory assembly includes a memory die bonded to a control die. The control die includes one or more control circuits for controlling the operation of the memory die. The control circuits are configured to receive a request to copy data on the memory die, read codewords on the memory die in response to the request, decode the codewords to identify errors in the codewords, correcting the errors in the codewords, and program the codewords back into the memory die. In one embodiment, the codewords read are stored in the memory die as single bit per memory cell data and the codewords programmed back into the memory die after correcting errors are programmed as multiple bit per memory cell data.

17 Claims, 27 Drawing Sheets

(56) References Cited

U.S. PATENT DOCUMENTS

| | | |
|---|---|---|
| 10,459,644 B2 | 10/2019 | Mehra |
| 10,565,123 B2 | 2/2020 | Song |
| 10,991,444 B1* | 4/2021 | Bazarsky ......... G11C 29/50004 |
| 2013/0103891 A1 | 4/2013 | Sharon |
| 2014/0136761 A1 | 5/2014 | Li |
| 2017/0148510 A1 | 5/2017 | Bazarsky |
| 2019/0179568 A1 | 6/2019 | Hsu |
| 2019/0341375 A1 | 11/2019 | Hirano |
| 2020/0050512 A1* | 2/2020 | Basu ................... G06F 11/1048 |
| 2020/0313694 A1* | 10/2020 | Wu ...................... H03M 13/17 |

* cited by examiner

Sparse parity check matrix H

N=33 variable nodes

|     | v1 | v2 | v3 | v4 | v5 | v6 | v7 | v8 | v9 | v10 | v13 | v12 | v13 |
|-----|----|----|----|----|----|----|----|----|----|-----|-----|-----|-----|
| cn1 |    | 1  |    | 1  |    |    |    |    |    |     | 1   |     | 1   |
| cn2 | 1  |    |    |    |    |    | 1  |    |    |     |     | 1   |     |
| cn3 |    |    | 1  |    | 1  | 1  |    |    |    | 1   | 1   |     |     |
| cn4 |    | 1  |    |    |    |    |    | 1  |    |     | 1   |     |     |
| cn5 |    |    |    | 1  |    |    | 1  |    |    |     |     | 1   |     |
| cn6 | 1  |    |    | 1  | 1  |    |    | 1  |    |     |     |     |     |
| cn7 |    | 1  |    |    |    |    |    | 1  |    | 1   |     |     | 1   |
| cn8 |    |    |    | 1  |    |    | 1  |    |    |     | 1   | 1   |     |
| cn9 | 1  |    | 1  | 1  |    |    |    |    |    |     |     |     | 1   |
| cn10|    |    |    |    |    |    |    | 1  | 1  | 1   | 1   |     |     |

M=10 check nodes

Sparse bipartite graph, 392

394, 398, 396

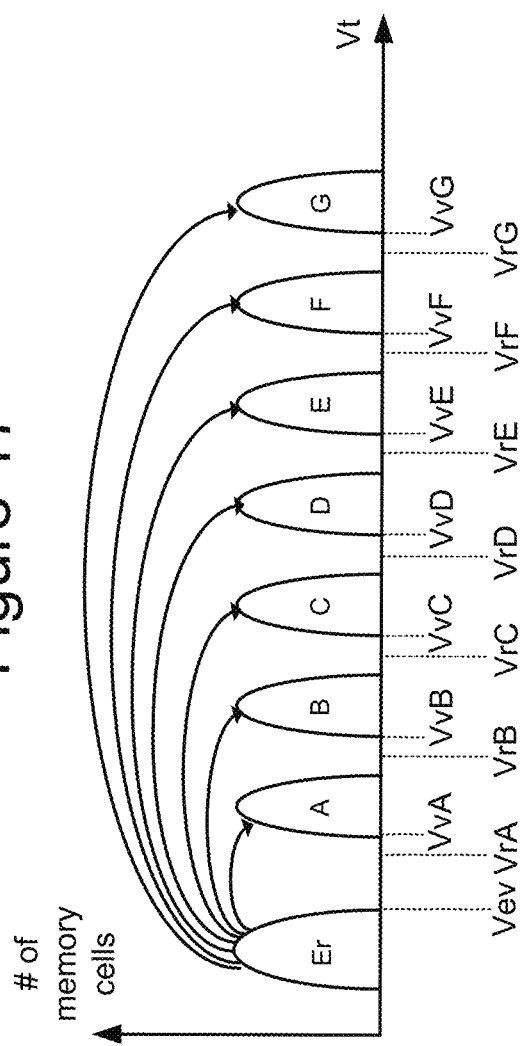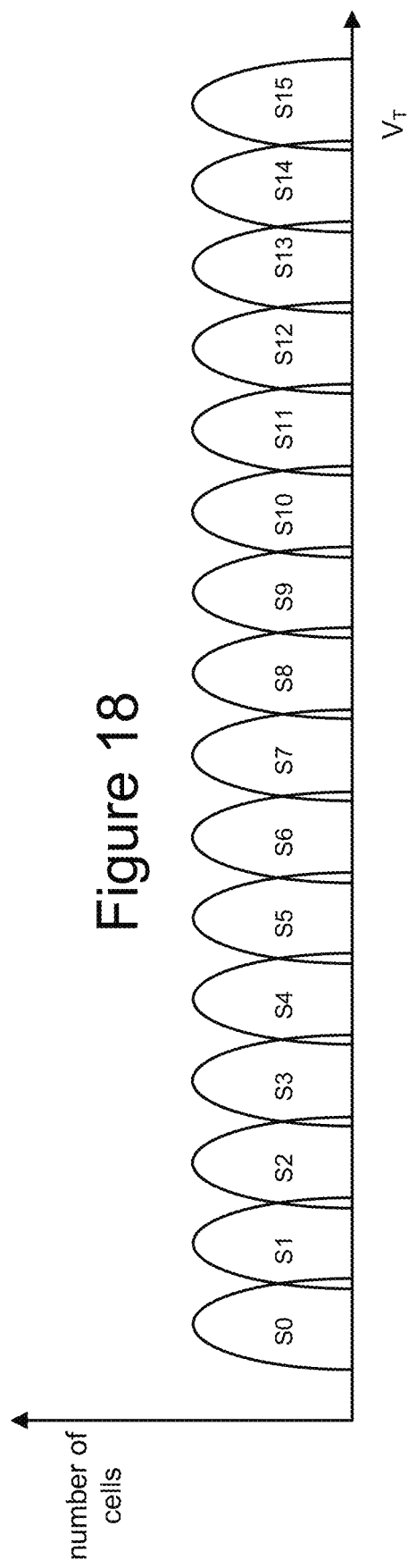

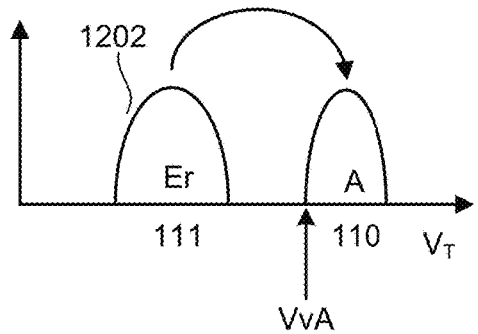
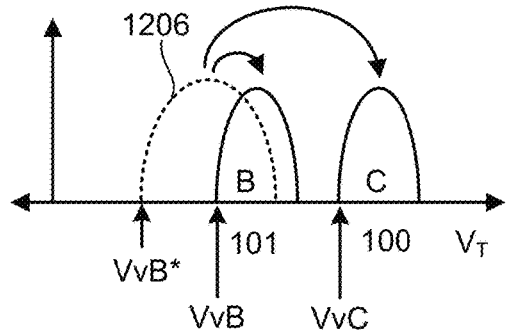
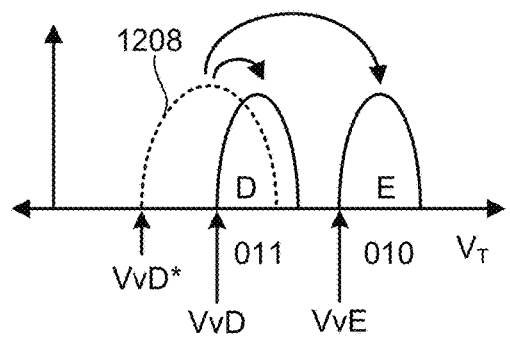
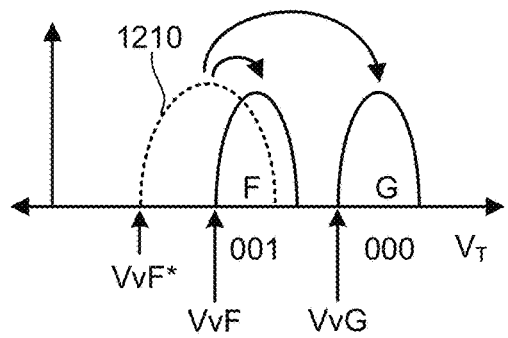
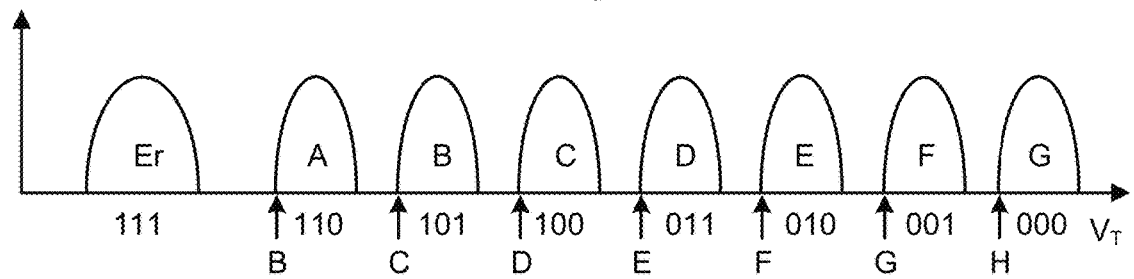

ON-CHIP-COPY FOR INTEGRATED MEMORY ASSEMBLY

BACKGROUND

The strong growth in demand for portable consumer electronic devices is driving the need for high-capacity storage devices. Non-volatile semiconductor memory devices, such as flash memory, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones, laptops and servers.

Non-volatile semiconductor memory devices typically include a memory controller connected to one or more memory die. Each memory die typically includes an array of memory cells, where the memory cell is the basic unit of storage. In some embodiments, a memory cell stores one bit of data. In other embodiments, a memory cell stores multiple bits of data. In addition to interfacing with a host device, the memory controller can perform various maintenance functions such as garbage collection, wear leveling, compacting or folding of data, rearranging data to free up blocks, etc. Sometimes, to perform its maintenance operations or for other reasons, the memory controller needs to copy data from a first location to a second location on the memory die. Implementation of such a copy operation can include reading the data from the first location on the memory die, transferring the data to the controller, correcting any errors in the data at the memory controller, transferring the data back to the memory die and programming the data to the second location on the memory die.

As non-volatile semiconductor memory devices are used in portable consumer electronics, it is beneficial to increase speed of operation and reduce power consumption.

DESCRIPTION OF THE DRAWINGS

FIG. 17 illustrates example threshold voltage distributions for a population of non-volatile memory cells when each memory cell stores three bits of data.

FIG. 18 illustrates example threshold voltage distributions for a population of non-volatile memory cells when each memory cell stores four bits of data.

FIGS. 20A-I depict threshold voltage distributions for a population of non-volatile memory cells during a process for programming.

DETAILED DESCRIPTION

Figure 1:
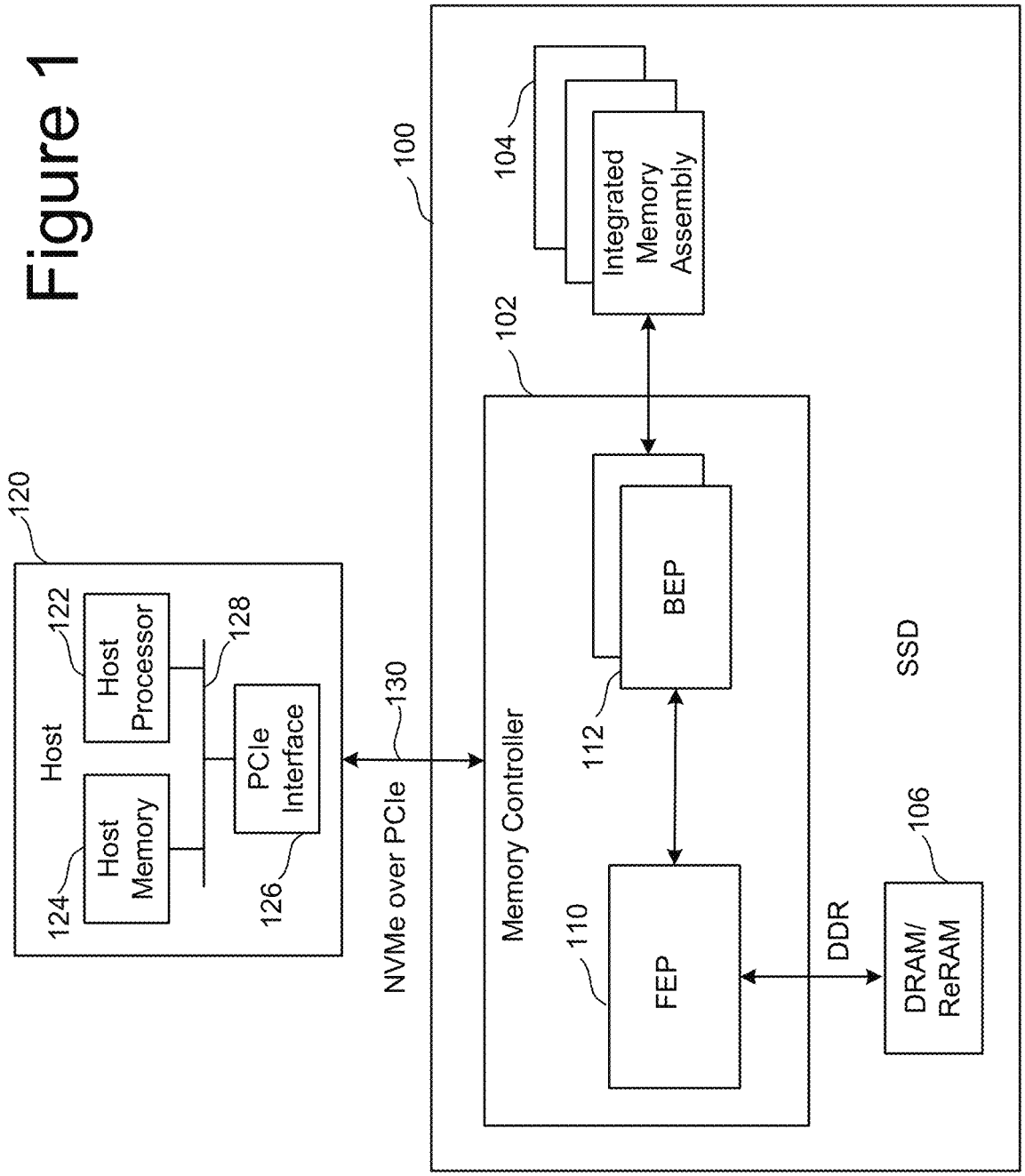
FIG. 1 is a block diagram of one embodiment of a memory system connected to a host.

An on-chip-copy process is disclosed that copies data from a first location on the memory die to a second location on the memory die without transferring the data to the memory controller. Avoiding the transfer to the memory controller increases the speed of operation for the copy process and reduces power consumption.

The on-chip-copy process is implemented on a memory device that includes an integrated memory assembly having one or more control die and one or more memory die. In some embodiments, the control die and the memory die are die bonded together. The memory die includes non-volatile memory cells. The control die controls various operations on the memory die, such as read, write, erase, and various maintenance operations. In one embodiment, the control die has the ability to encode data bits to form codewords that contain the data bits and parity bits (e.g., for error correction). The control die then stores the codewords in the non-volatile memory cells. In one embodiment, the control die has the ability to decode the codewords that were stored in the non-volatile memory cells. In some embodiments, the integrated memory assembly has multiple control dies and multiple memory dies such that each control die controls operation of one of the memory dies.

One embodiment includes a memory system having a memory controller in communication with the integrated memory assembly. The memory controller may comprise an Application Specific Integrated Circuit (ASIC), which is separate from the integrated memory assembly. The memory controller may send data to the control die, which the control die may encode into a codeword and store in the memory die. Similarly, the memory controller may send read requests to the control die, wherein the control die reads the codewords from the memory die, decodes the codewords, and returns the requested data to the controller.

In one embodiment, codewords are stored on the memory die. Each codeword may contain data bits and parity bits. In one embodiment, the codewords are decoded at the control die based on the parity bits. For example, a parity bit decoder may be used to decode the codewords. In some embodiments, the memory controller is able to decode codewords using the parity bits in the event that a control die failed to decode the codeword. In some embodiments, the memory controller uses a different technique to decode the codewords than the control dies. For example, the memory controller may use a soft bit decoder, whereas the control dies may each use a hard bit decoder.

In one embodiment, if the control die successfully decodes a codeword, the control die sends the data bits but not the parity bits to the memory controller. The number of parity bits per data bits may vary depending on the coding scheme. However, as one example, the parity bits may be about ten percent of the codeword. By not sending the parity bits to the memory controller, substantial bandwidth is saved on the communication pathway between the memory controller and the control die. Also, substantial power may be saved. For example, the interface between the control die and the memory controller could be a high speed interface.

In some embodiments, the control die and the memory die are bonded together with many bond pads that permit communication between the control die and the memory die. In one embodiment, the control die is able to access data from the memory die through the bond pads. In one embodiment, each data bit and each parity bit of a codeword is read via a different bond pad. This, in effect, provides an interface that is much wider than a data bus between the integrated memory assembly and the memory controller. Therefore, transferring the codewords from the memory die to the control die is very efficient. A net effect is that having decoding on the control die can be more efficient use of communication bandwidth than decoding on the memory controller.

In one embodiment, if the control die is not successful at decoding a codeword, then the control die sends the codeword to the memory controller. The memory controller also is able to decode the codewords. The memory controller may thus decode codewords that the control die was unable to decode. In an embodiment, the memory controller is able to decode codewords that have a higher bit error rate (BER) than the control die is able to decode.

In other words, the control die and the memory controller may use different techniques to decode the codewords. In one embodiment, a technique used by the control die may use less power than a technique used by the memory controller. Hence, decoding on the control die may use less power than decoding on the memory controller.

Codewords may be decoded according to variety of techniques. Some techniques may have a relatively high throughput and low power consumption but may provide relatively low error correction capability, while other techniques may provide relatively high error correction capability but may have lower throughput and increased power consumption. In one embodiment, the control die uses a relatively high throughput and low power consumption technique, which may provide relatively low error correction capability. In one embodiment, the controller uses one or more relatively low throughput and higher power consumption techniques, which may provide relatively high error correction capability.

In one embodiment, the control die is able to make fast decisions based on an estimated BER of a codeword. In one embodiment, the control die calculates a syndrome weight of a codeword. The control die may estimate a BER based on the syndrome weight. The control die may make a variety of decoding decisions based on the estimated BER. For example, the control die may change voltage levels that are used to sense the memory cells based on the estimated BER. Significantly, the control die can make such decisions without the need to transfer data to the controller. Hence, considerable bandwidth and power may be saved.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements such a memory cells. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

As discussed above, one operation that a memory system can perform is copying data from one location (the source location) on a memory die to a second location (the destination location) on the memory die. There are at least two methods to perform such a copy operation. In a first example, the data being copied is read, transmitted back to the memory controller for decoding to fix any errors, encoded with error correction information (e.g., parity bits), transmitted back to the memory die and then programmed to the destination location. In a second example, the data is copied from a source location on the memory die to the destination location on the memory die without transmitting the data to the memory controller. This second example is referred to as "on-chip-copy." Since on-chip-copy avoids data transfers to the memory controller, the copy process is competed faster and uses less power (e.g., due to no bus transfer). However, since memory systems traditionally do not have the ability to perform the decoding process at the memory die, the on-chip-copy process could result in the data accumulating errors. Therefore, in one embodiment on-chip-copy functionality is added to the control die and leverages the decoder on the control die such that the implementation of an on-chip-copy includes some level of decoding and fixing errors prior to programming the data being copied to the destination location.

One embodiment for implementing the on-chip-copy process using the integrated memory assembly disclosed herein includes the control die receiving a request from the memory controller to perform an on-chip-copy process for data stored on the memory die. In response to that request, the control die reads one or more codewords from a first set of non-volatile memory cells on the memory die and stores those codewords on the control die. The control die performs a (partial or full) decoding process for the codewords, identifies errors in the codewords during the decoding process and corrects the errors in the codewords stored on the control die. That decoding process, identifying errors and correcting errors are performed by and on the control die. After correcting the identified errors in the codewords, the control die programs the codewords to a second set of non-volatile memory cells on the memory die. The process of reading the data, decoding, identifying errors, correcting errors, and programming are performed without transferring the data to the controller. In some embodiments, the on-chip-copy process is performed without any work done by the memory controller (other than issuing the request to perform the on-chip-copy and receiving an acknowledgment from the control die that is has been completed).

FIGS. 1-5 describe one example of a memory system that can be used to implement the technology proposed herein. FIG. 1 is a block diagram of one embodiment of a memory system 100 connected to a host 120. Memory system (e.g., non-volatile memory system) 100 can implement the technology disclosed herein. Many different types of memory systems can be used with the technology disclosed herein. One example memory system is a solid state drive ("SSD"); however, other types of memory systems can also be used including removable memory cards and USB memory devices. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. Ion one embodiment, the ASICs for each of the BEP circuits 112 and the FEP circuit 110 are implemented on the same semiconductor such that memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, there are a plurality of integrated memory assemblies 104. In an embodiment, each integrated memory assembly 104 includes one or more memory die and one or more control die. Each memory die may include one or more memory structures. A control die may control operations on a memory die. For example, a control die may control and perform read, write, and erase operations on a memory die. In one embodiment, memory controller 102 communicates with a control die in order to instruct the control die to perform read, write, or erase operations on one or more non-volatile memory die or one or more memory structures. In one embodiment, each memory die in the integrated memory assembly 104 utilizes NAND flash memory (including two dimensional NAND flash memory and/or three dimensional NAND flash memory). In other embodiments, the integrated memory assembly 104 can include other types of memory; for example, PCM memory and MRAM.

Memory controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
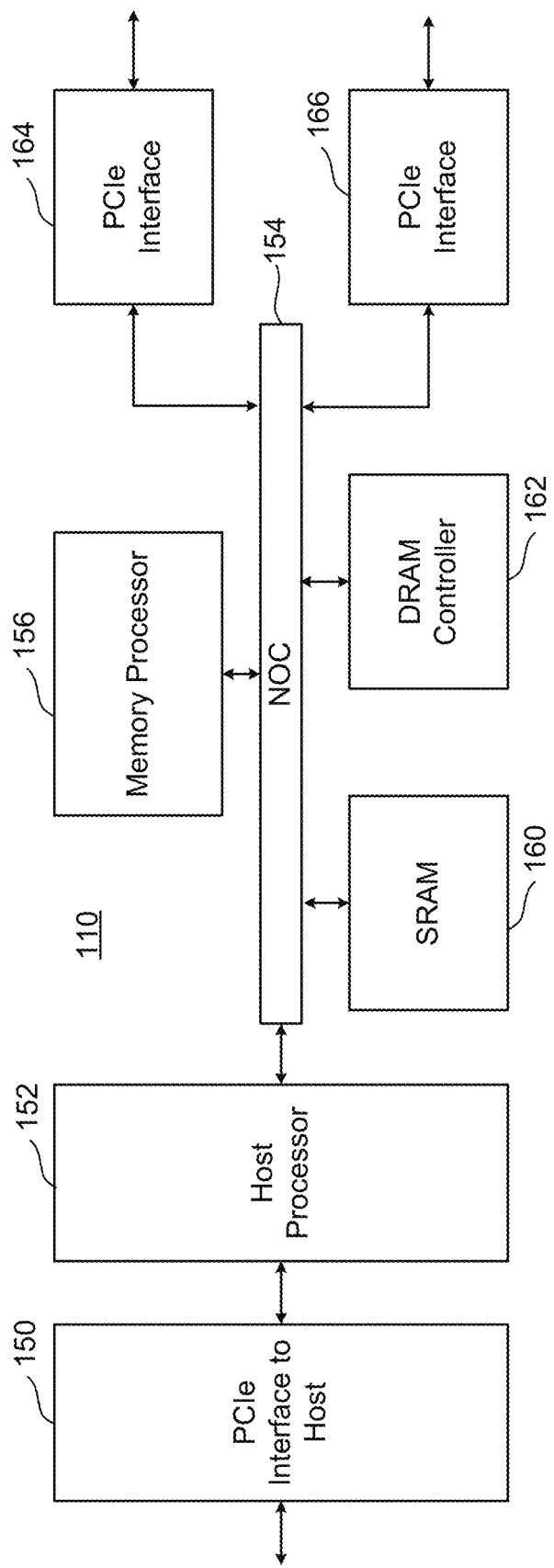
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
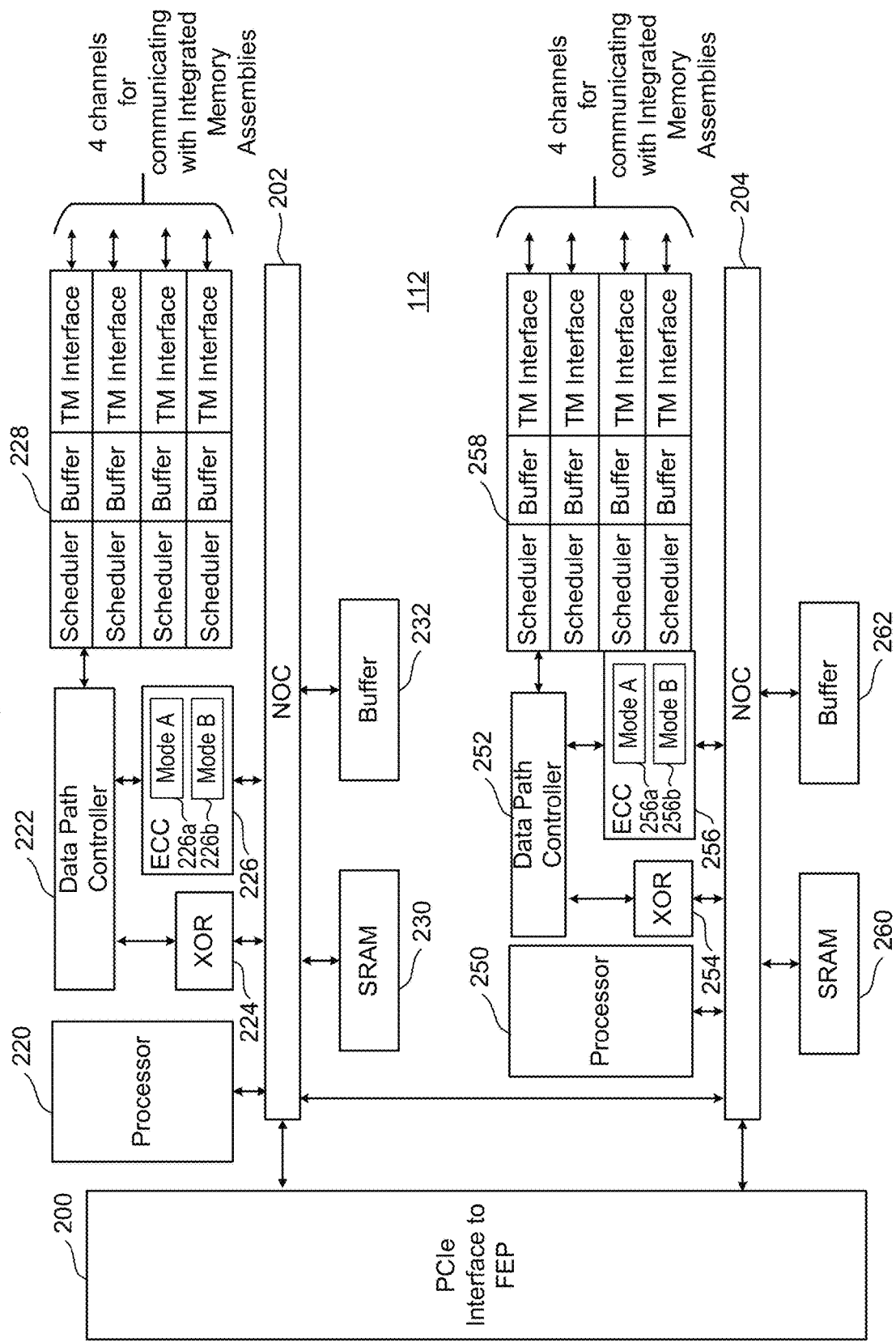
FIG. 3 is a block diagram of one embodiment of a Back End Processor Circuit.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256). The ECC engines 226/256 are used to perform error correction, as known in the art. Herein, the ECC engines 226/256 may be referred to as controller ECC engines.

The ECC engines 226/256 may encode data bytes received from the host, and may decode and error correct the data bytes read from the control die 304. In some embodiments, the ECC engines 226/256 calculate parity bits for each unit of data (e.g., page) that is being stored at one time. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

In some embodiments, memory controller 102 does not send the entire codeword to an integrated memory assembly 104. Instead, memory controller 102 sends only the data bits, with a control die on the integrated memory assembly 104 generating the parity bits. Optionally, memory controller 102 could send the entire codeword. In some cases, a control die of the integrated memory assembly 104 does not send an entire codeword to memory controller 102. Instead, the control die decodes the codeword, and sends back only the data bits to memory controller 102. However, in some cases, the control die may be unable to successfully decode a codeword. In this case, the control die may send the entire codeword to memory controller 102, which uses ECC engines 226/256 to decode the codeword.

In some embodiments, the ECC engines have different modes, such as ECC mode A 226a/256a and ECC mode B 226b/256b. The two modes may differ in their resolution. In general, a higher resolution decoder is able to correct a higher number of bit errors. In one embodiment, the resolution refers to the number of bits in messages that are passed in an iterative message passing decoder. For example, the messages in ECC Mode B 226b/256b may have 6 bits, whereas the messages in ECC Mode A 226a/256a may have 3 bits. In some embodiments, using fewer bits in the messages (corresponding to a lower resolution) results in faster decoding. Using fewer bits in the messages may also consume less power. Further details of decoders having different resolutions are described in U.S. Pat. No. 10,218,384, entitled "ECC Decoder with Multiple Decode Modes," which is incorporated herein by reference.

The XOR engines 224/254 may be used to form redundancy information that is based on information from each codeword in a set of codewords. The redundancy information may be stored in one of the memory dies. This redundancy information may be used to recover the data bits for each of the codewords in the set. As one example, each codeword could be 4 kilobytes, each codeword may be for one page of data, and redundancy information may be formed from a bitwise XOR of each of the codewords. In one embodiment, the bitwise XOR has the same number of bits of each codeword.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 3. Additionally, memory controllers with structures different than FIGS. 2 and 3 can also be used with the technology described herein.

Figure 4:
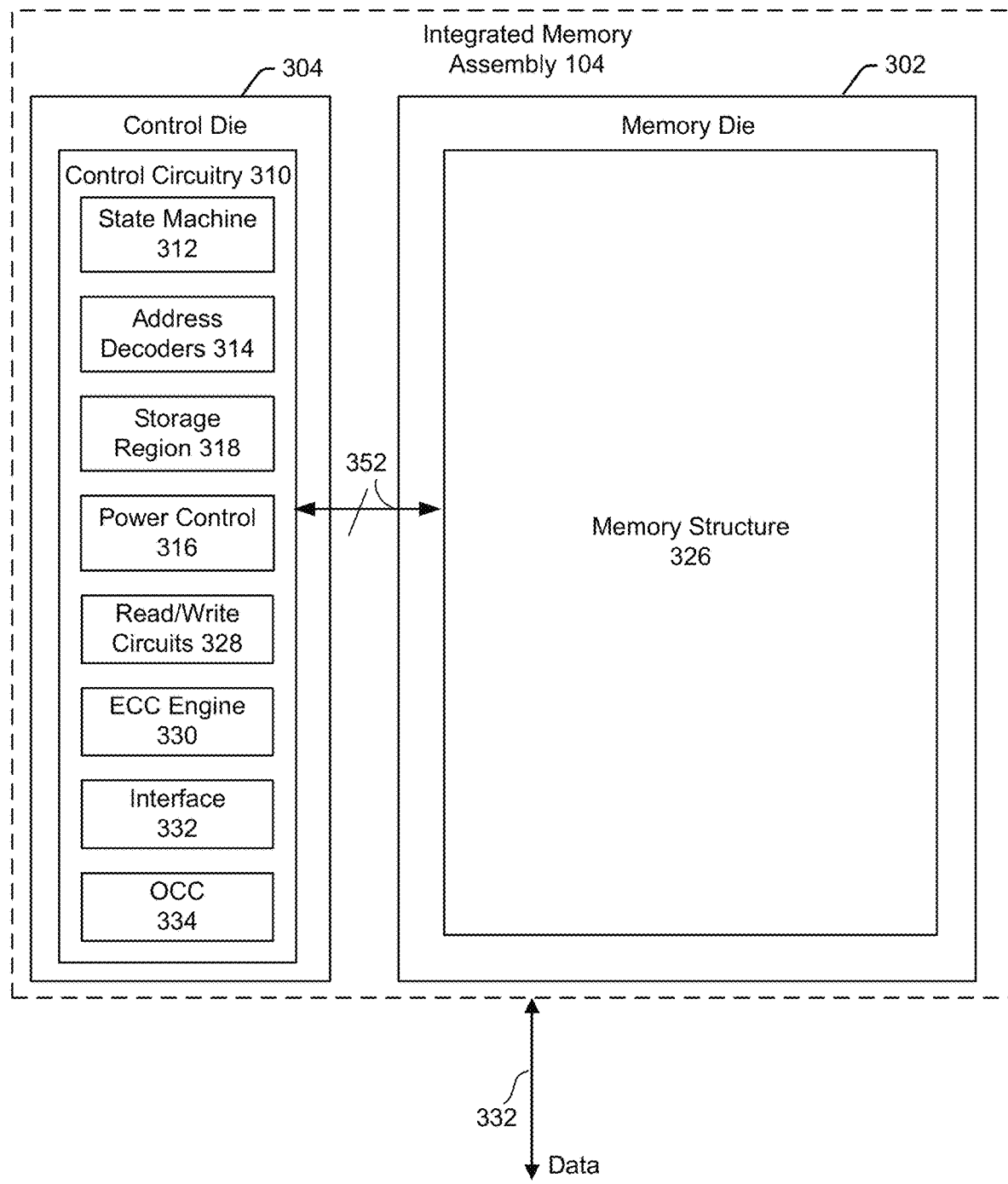
FIG. 4 is a functional block diagram of an integrated memory assembly.

FIG. 4 is a functional block diagram of one embodiment of an integrated memory assembly 104. In one embodiment, the integrated memory assembly 104 includes two semiconductor die (or more succinctly, "die"): memory die 302 and control die 304. Memory die 302 includes include memory structure 326. Memory structure 326 may contain non-volatile memory cells. Control die 304 includes control circuitry 310. In some embodiments, the memory die 302 and the control die 304 are bonded together, as will be described in more detail below.

Control circuitry 310 comprises a set of electrical circuits that perform memory operations (e.g., write, read, erase and others) on memory structure 326. Control circuitry 310 includes state machine 312, an on-chip address decoder 314, a power control circuit 316, storage region 318, read/write circuits 328, ECC engine 330, memory controller interface 332 and on-chip-copy circuit 334. In another embodiment, a portion of the read/write circuits 328 are located on control die 304 and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage of data. Herein, the term, "control die," "control semiconductor die," or the like, means a semiconductor die that contains control circuitry for performing memory operations on non-volatile memory cells on a memory die. Typically, numerous semiconductor die are formed from a single semiconductor (e.g., silicon) wafer.

State machine 312 is an electrical circuit that controls the operations performed by control die 304.

The on-chip address decoder 314 provides an address interface between addresses used by host 120 or memory controller 102 to the hardware address used by row decoders and column decoders (not expressly depicted in FIG. 4). Power control circuit 316 controls the power and voltages supplied to the word lines, bit lines, and select lines during memory operations. The power control circuit 316 includes voltage circuitry, in one embodiment. Power control circuit 316 may include charge pumps or other voltage sources for creating voltages. The power control circuit 316 executes under control of the state machine 312.

The read/write circuits 328 includes sense blocks (which may contain sense amplifies (SA), in some embodiments. The sense amplifies include bit line drivers, in some embodiments. The read/write circuits 328 executes under control of the state machine 312, in one embodiment. Each memory structure 326 is addressable by word lines via a row decoder (not depicted in FIG. 3A) and by bit lines via a column decoder (not depicted in FIG. 3A), in some embodiments.

The error correction code (ECC) engine 330 is a circuit configured to decode and error correct codewords. Herein, ECC engine 330 may be referred to as an on-die ECC engine. In one embodiment, the on-die ECC engine 330 is configured to encode data bits from memory controller 102 into codewords that contain the data bits and parity bits. The control circuitry stores the codewords in the memory structure 326. In one embodiment, the on-die ECC engine 330 is also configured to decode the codewords which are read from the memory structure 326. In some embodiments, if the on-die ECC engine 330 is successful at decoding a codeword, then the control die 304 only sends back the data bits to the memory controller 102. In some embodiments, if the on-die ECC engine 330 is not successful at decoding a codeword, then the memory controller ECC engine 226/256 may be used to decode the codeword.

In some embodiments, first the control die 304 attempts to decode a codeword using ECC engine 330. If decoding fails, the memory controller 102 may attempt to decode that codeword. In some embodiments, the memory controller 102 has multiple ECC modes. For example, ECC mode A 226A (see FIG. 3) may be used to attempt to decode a codeword that the control die 304 could not decode. If ECC Mode A 226a fails to decode the codeword, then ECC mode B 226b may be used by the memory controller 102. For example, the on-die ECC engine 330 may use a hard bit decoder to attempt to decode a codeword. Under typical conditions, hard bit decoding may be successful most of the time. In the event that the on-die ECC engine 330 fails to successfully decode the codeword, the codeword may be passed to memory controller 102. In one embodiment, memory controller 102 first attempts to decode using a soft bit decoder at one level of resolution. This first attempt may be made by ECC Mode A 226a. If the first attempt by memory controller 102 fails, then the memory controller may use a soft bit decoder at higher level of resolution. This second attempt may be made by ECC Mode B 226b. Note that the aforementioned hard bit decoder may use less power than the soft bit decoders. Hence, most of the time the decoding may be achieved using a low power decoder on the control die 304. None of the on-die ECC engine 330, ECC Mode A 226A, nor ECC Mode B 226b are limited to the foregoing examples.

On-chip-copy circuit 334 is an electrical circuit used to perform the on-chip-copy operation proposed herein, and described in more detail below. In some embodiments, the technology for performing the on-chip-copy operation is included in state machine 312. In some embodiments, the technology for performing the on-chip-copy operation is included in software for state machine 312 or another type of processor.

State machine 312, on-die ECC engine 330, on-chip-copy circuit 334 and/or controller 102 (or equivalently functioned circuits), in combination with all or a subset of the circuits of control circuitry 310, can be considered one or more control circuits. The one or more control circuits can include hardware only (e.g., electrical circuits) or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), microcontroller, integrated circuit or other type of circuit.

Pathways 352 are pathways between one or more components in the control circuitry 310 and the memory structure on memory die 302. A portion of each pathway resides in memory die 302 and a portion of each pathway resides in control die 304. The term pathway may be used for a portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. In one embodiment, pathways 352 allow the control circuitry 310 to provide voltages to word lines, select lines, and bit lines on memory die 302. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

Memory controller interface 332 is an electrical interface for communicating with memory controller 102. For example, memory controller interface 332 may implement a Toggle Mode Interface that connects to the Toggle Mode interfaces of memory interface 228/258 for memory controller 102. In one embodiment, memory controller interface 332 includes a set of input and/or output (I/O) pins that connect to communication channel 332 (also refers to herein as a data bus). In one embodiment, communication channel 332 connects to the memory controller 102 as part of the Toggle Mode Interface. In one embodiment, a communication channel 332 of one integrated memory assembly 104 connects to another integrated memory assembly 104.

Communication channel 332 is depicted as being connected to integrated memory assembly 104 for generality. Communication channel 332 may connect to either or both of die 302 and/or 304. In one embodiment, communication channel 332 connects memory controller 102 directly to control die 304. In one embodiment, communication channel 332 connects memory controller 102 directly to memory die 302. If communication channel 332 connects memory controller 102 directly to memory die 302, then pathway 352 may be used to allow communication between memory controller 102 and control circuitry 310.

In one embodiment, memory structure 326 comprises a monolithic three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include phase change memory ("PCM"), Magnetoresistive Random-Access Memory ("MRAM"), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 4 depicts one control die 304 and one memory die 302 in an integrated memory assembly 104, there may be more than one control die 304 and more than one memory die 302 in an integrated memory assembly 104.

Figure 5:
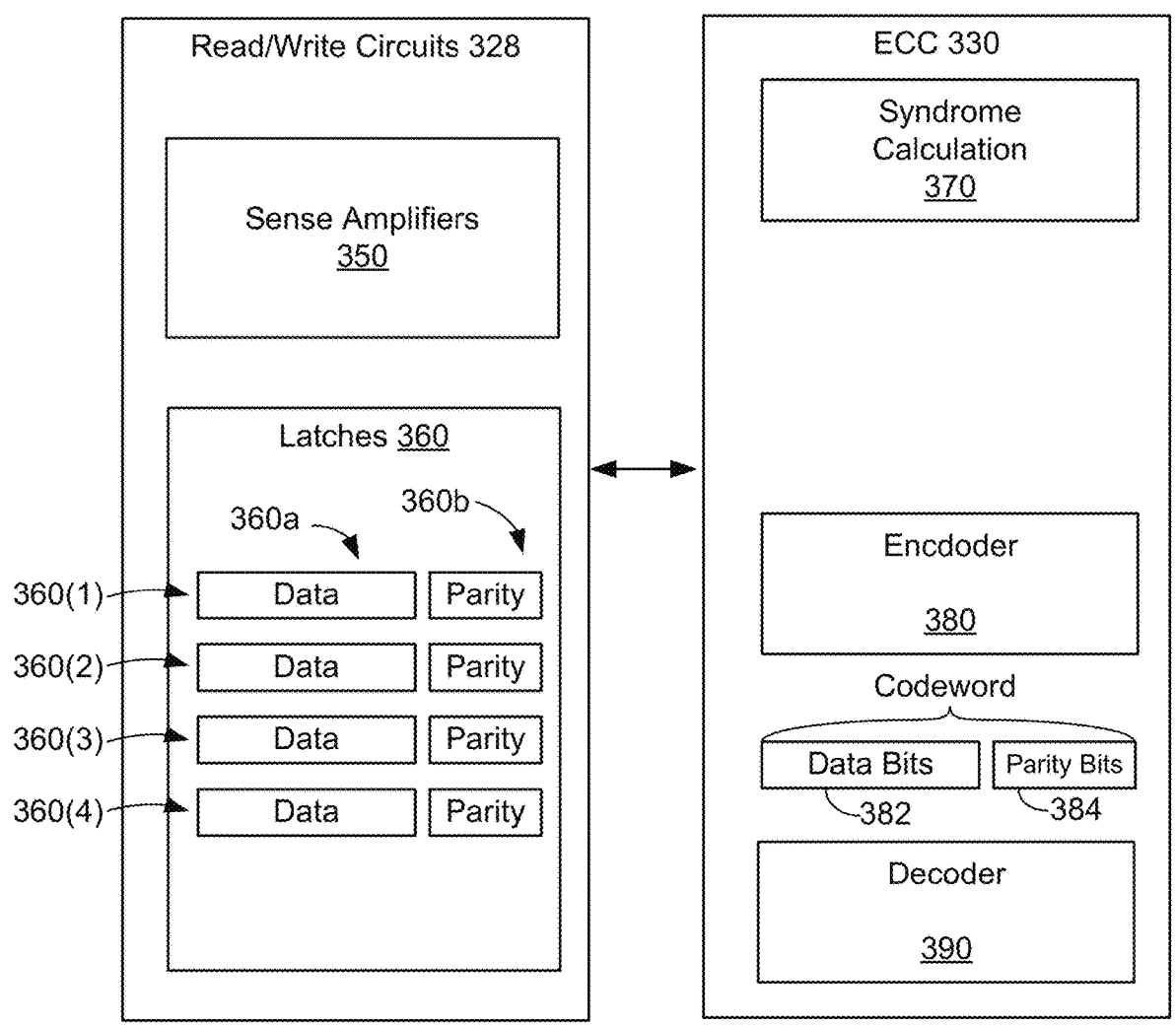
FIG. 5 is a block diagram of one embodiment of a read/write circuits and ECC circuit of an integrated memory assembly.

FIG. 5 is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 5 depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In an embodiment in which three bits are stored per memory cell, three pages are stored in a set of memory cells and the four pages may be referred to as a lower page (LP), middle page (MP), and an upper page (UP). In another embodiment, the sense amplifiers 350 are on the memory die 302, but the latches 360 remain on the control die 304.

The on-die ECC engine 330 is able to encode data bits received from memory controller 102. In one embodiment, the on-die ECC engine 330 forms codewords that each contain data bits and parity bits. In one embodiment, memory controller 102 provides the codewords to the control die 304. The control circuitry 310 stores the codewords into non-volatile memory cells in the memory structure 326. Upon a request from memory controller 102 to read data, control circuitry 310 reads codewords from memory structure 326. The on-die ECC engine 330 is also able to decode and error correct the codewords read from the memory structure 326. In some embodiments, the on-die ECC engine 330 calculates parity bits for each unit of data (e.g., page) that is being stored. The parity bits (also referred to as an error correction code or part of an error correction code) may be stored with the unit of data (e.g., page). The combination of the unit of data and its associated parity bits are referred to as a codeword. In one embodiment, the parity bits are stored remotely from the unit of data (e.g., page).

In an embodiment, upon successfully decoding a codeword, the control die 304 sends only the data bits, but not the parity bits, to memory controller 102. Therefore, bandwidth over communication lines between memory controller 102 and the integrated memory assembly 104 is saved. Also, substantial power may be saved. For example, the interface between the control die and the controller could be a high speed interface.

The on die ECC engine 330 includes syndrome calculation logic 370, an encoder 380, and a decoder 390. The encoder 380 is configured to encode data using an ECC scheme, such as a low-density parity check (LDPC) encoder, a Reed Solomon encoder, a Bose-Chaudhuri-Hocquenghem (BCH) encoder, a Turbo Code encoder, an encoder configured to encode one or more other ECC encoding schemes, or any combination thereof. The encoder 380 may form a codeword, which contains data bits 382 and parity bits 384. The data bits may be provided by memory controller 102.

In one embodiment, the data bits 382 are stored in the data latches 360a, and the parity bits 384 are stored in the parity latches 360b. Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming by applying the program voltage and boosting voltages to various word lines of memory structure 326. Decoder 390 is configured to decode the codewords that were stored in the memory die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword. In one embodiment, the decoder 390 is a relatively low power decoder, as compared to a decoder on memory controller 102. In one embodiment, the decoder on memory controller 102 is able to correct more bit errors in the codeword than can typically be corrected by decoder 390. Thus, decoder 390 may provide a power versus error correction capability tradeoff. For example, decoder 390 may be very efficient with respect to power consumption, but at the expense of possibly not being able to correct a high number of errors in a codeword.

In one embodiment, the decoder 390 implements a hard bit decoder. In another embodiment, the decoder 390 implements a soft bit decoder. Alternatively, decoder 390 may implement both a hard bit decoder and a soft bit decoder. For example, the control die 304 may first attempt to decode a codeword with the hard bit decoder. If that fails, then the control die 304 may attempt to decode using the soft bit decoder.

In some embodiments, the decoder 390 is based on a sparse bipartite graph having bit (or variable) nodes and check nodes. The decoder 390 may pass messages between the bit nodes and the check nodes. Passing a message between a bit node and a check node is accomplished by performing a message passing computation. The message passing computation may be based on belief propagation.

Syndrome calculation logic 370 (e.g., an electrical circuit and/or software) is able to determine a syndrome weight for codewords. The syndrome weight refers to the number of parity check equations that are unsatisfied. The initial syndrome weight of a codeword may correlate with the bit error rate (BER) of that codeword. Thus, the control die 304 may estimate a BER for a codeword based on the initial syndrome weight. In one embodiment, the syndrome logic is implemented in hardware. The syndrome weight can be determined without fully decoding a codeword. Hence, the initial syndrome weight can be calculated in less time and with less power than for decoding a codeword. In some embodiments, the control die 304 makes management decisions based on the estimated BER. For example, the control die 304 may determine what technique should be used to decode a codeword, what read reference voltages should be used to read memory cells, etc. based on the estimated BER.

Figures 6A, 6B:
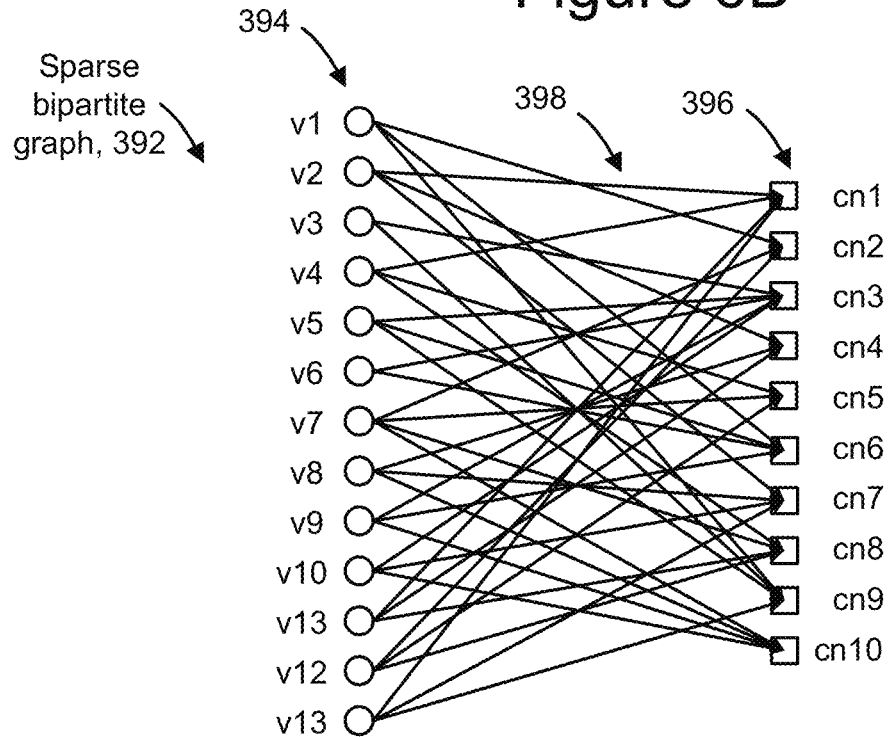
FIG. 6A depicts an example of a sparse parity check matrix H.
FIG. 6B depicts a sparse bipartite graph which corresponds to the sparse parity check matrix of FIG. 6A.

In one embodiment, on-die ECC engine 330 uses a sparse parity check matrix. FIG. 6A depicts an example of a sparse parity check matrix H (which may also be represented as a sparse bipartite graph). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 6B depicts a sparse bipartite graph 392 which corresponds to the sparse parity check matrix of FIG. 6A. Specifically, the code can be defined by a sparse bipartite graph G=(V,C,E) with a set V of N bit nodes 394 (N=13 in this example), a set C of M check nodes 396 (M=10 in this example) and a set E (E=38 in this example) of edges 398 connecting bit nodes 394 to check nodes 396. The bit nodes correspond to the codeword bits and the check nodes correspond to parity-check constraints on the bits. A bit node 394 is connected by edges 398 to the check nodes 396 it participates in.

During decoding, one embodiment of the decoder 390 attempts to satisfy the parity checks. In this example, there are ten parity checks, as indicated by the check nodes cn1 through cn10. The first parity check at cn1 determines if $v2 \oplus v4 \oplus v11 \oplus v13=0$, where "$\oplus$" denotes the exclusive-or (XOR) logical operation. This check is satisfied if there is an even number of "1" in bits corresponding to variable nodes v2, v4, v11 and v13. This check is denoted by the fact that arrows from variable nodes v2, v4, v11 and v13 are connected to check node cn1 in the bi-partite graph. The second parity check at cn2 determines if $v1 \oplus v7 \oplus v12=0$, the third parity check at cn3 determines if $v3 \oplus v5 \oplus v6 \oplus v9 \oplus v1 \oplus =0$, the fourth parity check at cn4 determines if $v2 \oplus v8 \oplus v11=0$, the fifth parity check at cn5 determines if $v4 \oplus v7 \oplus v12=0$, the sixth parity check at cn6 determines if $v1 \oplus v5 \oplus v6 \oplus v9=0$, the seventh parity check at cn7 determines if $v2 \oplus v8 \oplus v10 \oplus v13=0$, the eighth parity check at cn8 determines if $v4 \oplus v7 \oplus v11 \oplus v12=0$, the ninth parity check at cn9 determines if $v1 \oplus v3 \oplus v5 \oplus v13=0$ and the tenth parity check at cn10 determines if $v7 \oplus v8 \oplus v9 \oplus v10=0$.

In one embodiment, the decoder 390 uses an iterative probabilistic decoding process involving iterative message passing decoding algorithms. These algorithms operate by exchanging messages between bit nodes and check nodes over the edges of the underlying bipartite graph representing the code.

The decoder 390 may be provided with initial estimates of the codeword bits (based on the content that is read from the memory structure 326). These initial estimates may be refined and improved by imposing the parity-check constraints that the bits should satisfy as a valid codeword. This may be done by exchanging information between the bit nodes representing the codeword bits and the check nodes representing parity-check constraints on the codeword bits, using the messages that are passed along the graph edges.

Figure 7:
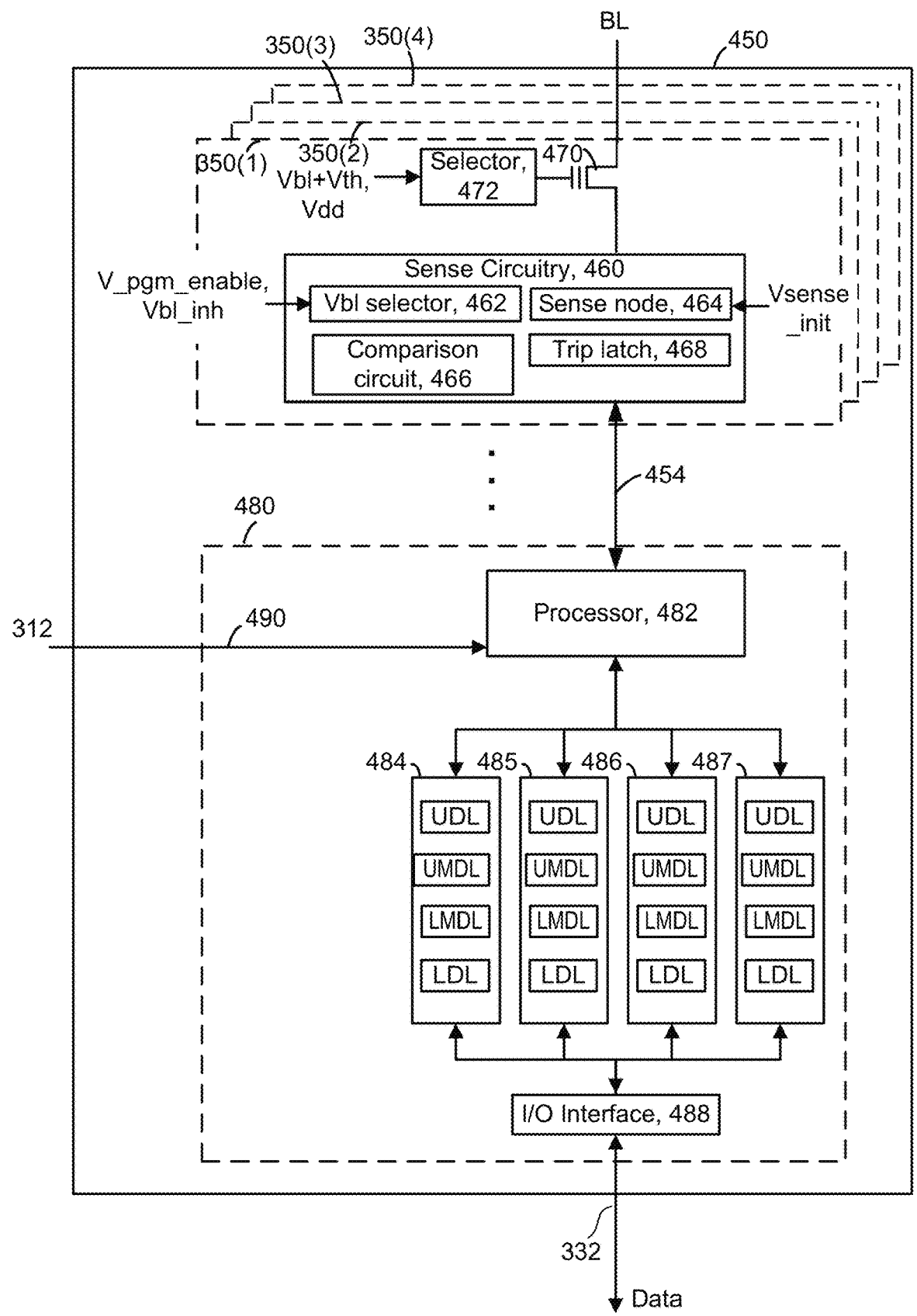
FIG. 7 is a block diagram depicting one embodiment of a sense block.

FIG. 7 is a block diagram depicting one embodiment of a sense block 450. The sense block is part of the read/write circuits 328. An individual sense block 450 is partitioned into one or more core portions, referred to as sense circuits or sense amplifiers 350(1)-350(4), and a common portion, referred to as a managing circuit 480. In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation (e.g., write operation).

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. The Vbl selector 462 can also be used during sensing operations. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line. The bit lines are part of memory structure 326 on memory die 302.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The managing circuit 480 comprises a processor 482, four example sets of data latches 484, 485, 486, 487 and an I/O Interface 488 coupled between the sets of data latches and data bus 332 (data bus may connect to memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell and, therefore, only three latches (LDL, MDL, UDL) per sense amplifier.

The processor 482 performs computations, such as to determine the data stored in the sensed memory cell and store the determined data in the set of data latches. Each set of data latches 484-487 is used to store data bits determined by processor 482 during a read operation, and to store data bits imported from the data bus 332 during a program operation which represent write data meant to be programmed into the memory. I/O interface 488 provides an interface between data latches 484-487 and the data bus 332.

The processor 482 may also be used to determine what voltage to apply to the bit line, based on the state of the latches.

During reading, the operation of the system is under the control of state machine 312 that controls the supply of different control gate voltages to the addressed memory cell (e.g., by applying voltages from power control 316 to word lines on the memory structure 326 via the pathways between control die 304 and memory die 302 discussed herein). As it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine via input lines 490. It then computes a binary encoding for the memory state and stores the resultant data bits into data latches 484-487.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because (in one embodiment) each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain milestones in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 8:
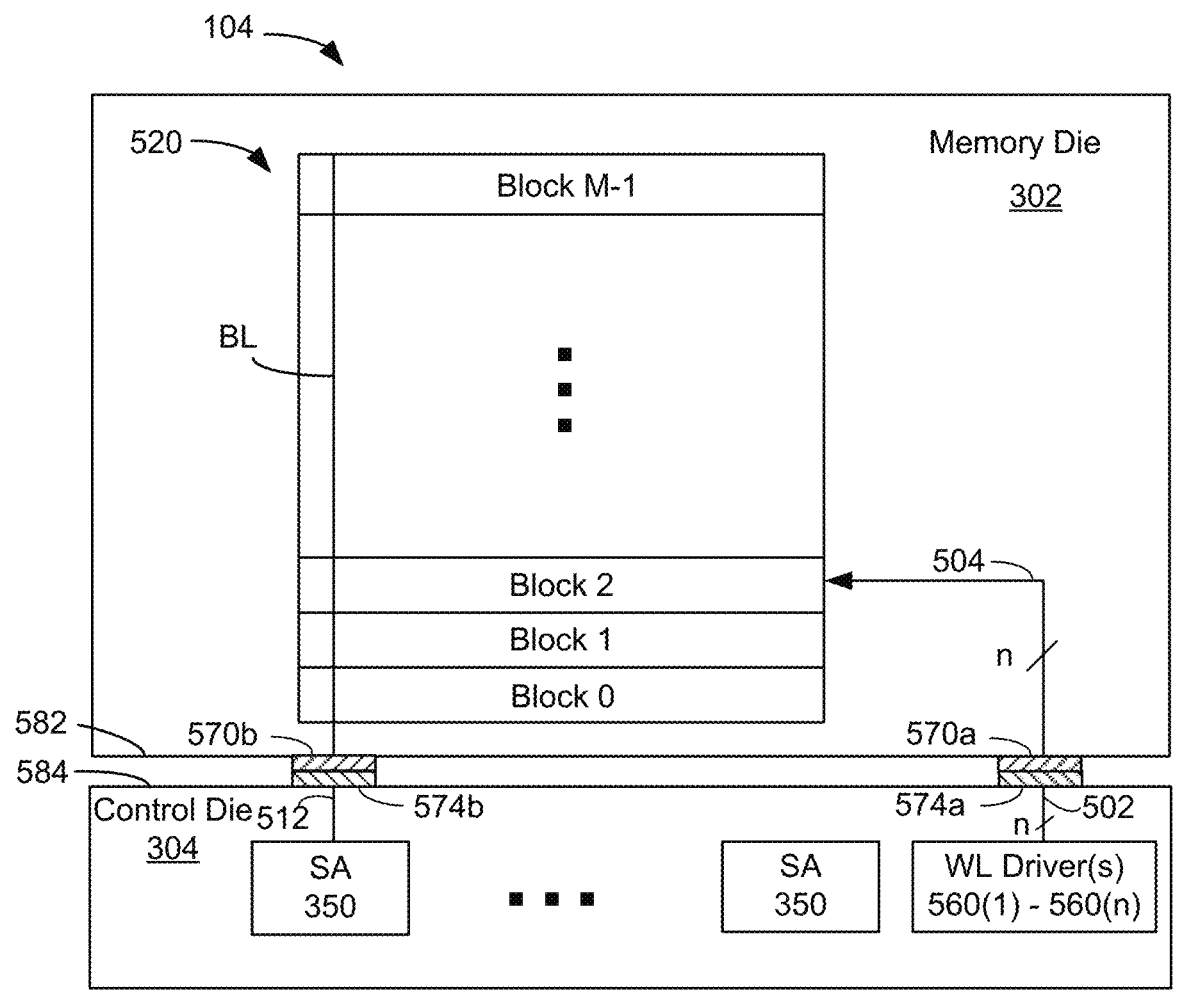
FIG. 8 is a block diagram of one embodiment of an integrated memory assembly.

FIG. 8 is a block diagram of one embodiment of an integrated memory assembly 104. FIG. 8 depicts further details of one embodiment of the integrated memory assembly 104 of FIGS. 1 and 4. Memory die 302 contains a plane 520 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 8, Block 0 and Block M−1 of plane 520 are at the edges of the memory structure (or otherwise referred to as being located in an edge region/section of the memory structure).

Control die 304 includes a number of sense amplifiers (SA) 350. Each sense amplifier 350 is connected to one bit line. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 560(1)-560(n). The word line drivers 560 are configured to provide voltages to word lines. In this example, there are "n" word lines per block of memory cells. In one embodiment, one of the blocks in the plane 520 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 560 (e.g. part of Power Control 316) provide voltages to the word lines in a first selected block (e.g., Block 2) in memory die 302. The control die 304 may also include charge pumps, voltage generators, and the like, which may be used to provide voltages for the word line drivers 560 and/or the bit line drivers.

The memory die 302 has a number of bond pads 570*a*, 570*b* on a first major surface 582 of memory die 302. There may be "n" bond pads 570*a*, to receive voltages from a corresponding "n" word line drivers 560(1)-560(n). There may be one bond pad 570*b* for each bit line associated with plane 520. The reference numeral 570 will be used to refer in general to bond pads on major surface 582.

In some embodiments, each data bit and each parity bit of a codeword are transferred through a different bond pad pair 570*b*, 574*b*. The bits of the codeword may be transferred in parallel over the bond pad pairs 570*b*, 574*b*. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 574*a*, 574*b* on a first major surface 584 of control die 304. There may be "n" bond pads 574*a*, to deliver voltages from a corresponding "n" word line drivers 560(1)-560(n) to memory die 302*a*. There may be one bond pad 574*b* for each bit line associated with plane 520. The reference numeral 574 will be used to refer in general to bond pads on major surface 582. Note that there may be bond pad pairs 570*a*/574*a* and bond pad pairs 570*b*/574*b*. In some embodiments, bond pads 570 and/or 574 are flip-chip bond pads.

In one embodiment, the pattern of bond pads 570 matches the pattern of bond pads 574. Bond pads 570 are bonded (e.g., flip chip bonded) to bond pads 574. Thus, the bond pads 570, 574 electrically and physically couple the memory die 302 to the control die 304. Also, the bond pads 570, 574 permit internal signal transfer between the memory die 302 and the control die 304. Thus, the memory die 302 and the control die 304 are bonded together with bond pads. Although FIG. 5A depicts one control die 304 bonded to one memory die 302, in another embodiment one control die 304 is bonded to multiple memory dies 302.

Herein, "internal signal transfer" means signal transfer between the control die 304 and the memory die 302. The internal signal transfer permits the circuitry on the control die 304 to control memory operations in the memory die 302. Therefore, the bond pads 570, 574 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 570, 574 may be formed for example of copper, aluminum and alloys thereof. There may be a liner between the bond pads 570, 574 and the major surfaces (582, 584). The liner may be formed for example of a titanium/titanium nitride stack. The bond pads 570, 574 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 570, 574. Several conductive pathways, which may be implemented with metal interconnects and/or vias are depicted. For example, a sense amplifier 350 may be electrically connected to bond pad 574b by pathway 512. There may be thousands of such sense amplifiers, pathways, and bond pads. Note that the BL does not necessarily make direct connection to bond pad 570b. The word line drivers 560 may be electrically connected to bond pads 574a by pathways 502. Note that pathways 502 may comprise a separate conductive pathway for each word line driver 560(1)-560(n). Likewise, there may be a separate bond pad 574a for each word line driver 560(1)-560(n). The word lines in block 2 of the memory die 302 may be electrically connected to bond pads 570a by pathways 504. In FIG. 8, there are "n" pathways 504, for a corresponding "n" word lines in a block. There may be a separate pair of bond pads 570a, 574a for each pathway 504.

Figure 9:
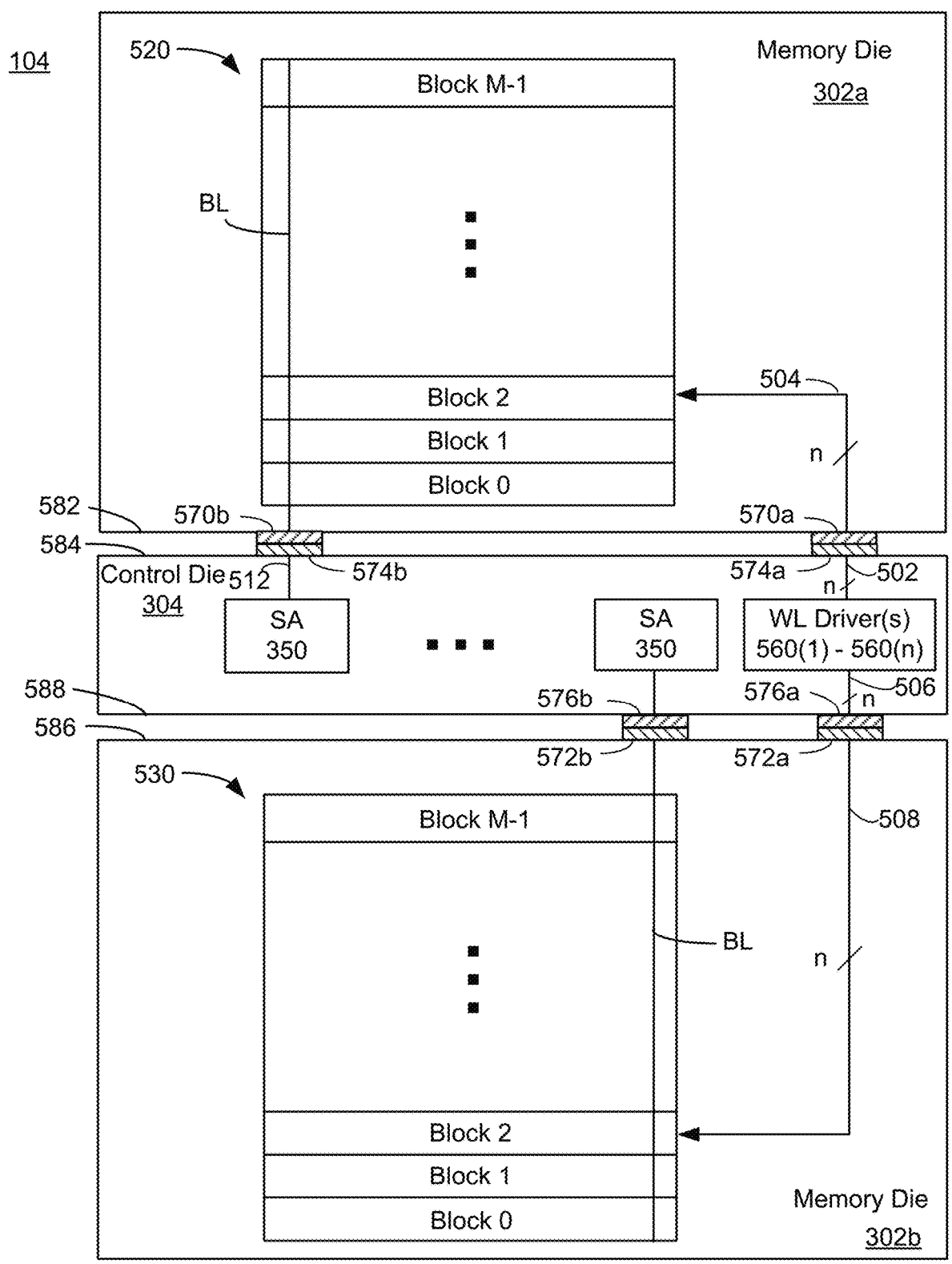
FIG. 9 is a block diagram of one embodiment of an integrated memory assembly in which a control die controls two memory dies.

FIG. 9 depicts another embodiment of an integrated memory assembly 104 in which one control die 304 may be used to control two memory die 302a, 302b. The control die 304 has a number of a number of bond pads 574(a), 574(b) on a first major surface 584, as discussed in connection with FIG. 8. The control die 304 has a number of a number of bond pads 576(a), 576(b) on a second major surface 588. There may be "n" bond pads 576(a) to deliver voltages from a corresponding "n" word line drivers 560(1)-560(n) to memory die 302b. The word line drivers 560 may be electrically connected to bond pads 576a by pathways 506. There may be one bond pad 576b for each bit line associated with plane 530 on memory die 302b. The reference numeral 576 will be used to refer in general to bond pads on major surface 588.

The second memory die 302b has a number of bond pads 572(a), 572(b) on a first major surface 586 of second memory die 302b. There may be "n" bond pads 572(a), to receive voltages from a corresponding "n" word line drivers 560(1)-560(n). The word lines in plane 530 may be electrically connected to bond pads 572a by pathways 508. There may be one bond pad 572(b) for each bit line associated with plane 530. The reference numeral 572 will be used to refer in general to bond pads on major surface 586. Note that there may be bond pad pairs 572(a)/576(a) and bond pad pairs 572(b)/576(b). In some embodiments, bond pads 572 and/or 576 are flip-chip bond pads.

In an embodiment, the "n" word line drivers 560(1)-560(n) are shared between the two memory die 302a, 302b. For example, a single word line driver may be used to provide a voltage to a word line in memory die 302a and to a word line in memory die 302b. However, it is not required that the word line drivers 560 are shared between the memory dies 302a, 302b.

Figure 10A:
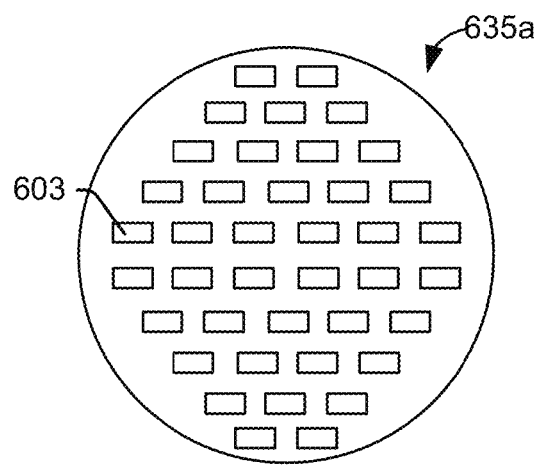
FIGS. 10A and 10B are top views of semiconductor wafers.

FIG. 10A is a top view of a semiconductor wafer 635a from which multiple control die 304 may be formed. The wafer 635a has numerous copies of integrated circuits 603. Each of the integrated circuits 603 contains the control circuitry 310 (see FIG. 4). Wafer 635a is diced into semiconductor dies, each containing one of the copies of the integrated circuits 603. Therefore, numerous control semiconductor dies 304 may be formed from the wafer 635a. Also note that even before the wafer 635a is diced, as the term "control semiconductor die" is used herein, each region in which an integrated circuit 603 resides may be referred to as a control semiconductor die 304.

Figure 10B:
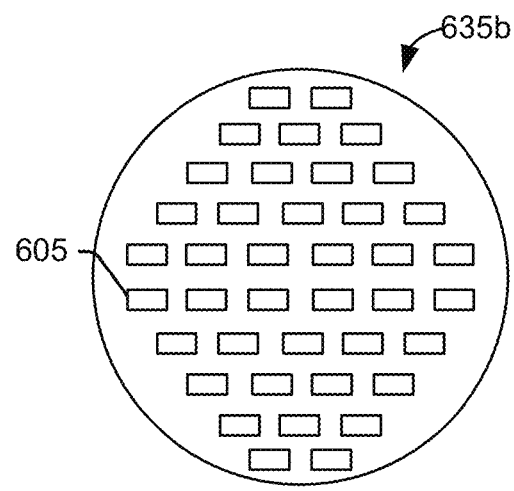

FIG. 10B is a top view of a semiconductor wafer 635b from which multiple memory die 302 may be formed. The wafer 635b has numerous copies of integrated circuits 605. Each of the integrated circuits 605 contains memory structure 326 (see FIG. 4), in one embodiment. The wafer 635b is diced into semiconductor dies, each containing one of the copies of the integrated circuits 605, in some embodiments. Therefore, numerous memory semiconductor dies 302 may be formed from the wafer 635b. Also note that even before the wafer 635b is diced, as the term "memory semiconductor die" is used herein, each region in which an integrated circuit 605 resides may be referred to as a memory semiconductor die 302.

The semiconductor wafers 635 may start as an ingot of monocrystalline silicon grown according to either a CZ, FZ or other process. The semiconductor wafers 635 may be cut and polished on major surfaces to provide smooth surfaces. The integrated circuits 603, 605 may be formed on and/or in the major surfaces. Note that forming the integrated circuits 603, 605 on different wafers 635a, 635b facilitates use of different semiconductor fabrication processes on the different wafers 635a, 635b. For example, semiconductor fabrication processes may involve high temperature anneals. Such high temperature anneals may be needed for formation of some circuit elements, or may be useful for improving properties of circuit elements. For example, a high temperature anneal can desirably reduce the resistance of polysilicon on the memory dies 302. However, the high temperature anneal could be damaging to other circuit elements. For example, a high temperature anneal can potentially be damaging to CMOS transistors, such as the transistors that may be used on the semiconductor dies 304. In one embodiment, a high temperature anneal that is used when fabricating the integrated circuits 605 on wafer 635b is not used when fabricating the integrated circuits 603 on wafer 635a. For example, in one embodiment, a high temperature anneal that is used when fabricating the memory dies is not used when fabricating the control dies.

The dicing of the wafers 635 into semiconductor dies may occur before or after bonding. In one embodiment, the two wafers 635, 635b are bonded together. After bonding the two wafers together, dicing is performed. Therefore, numerous integrated memory assemblies 104 may be formed from the two wafers 635. In another embodiment, the two wafers 635a, 635b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304 and a memory semiconductor die 302 bonded together.

Figure 10C:
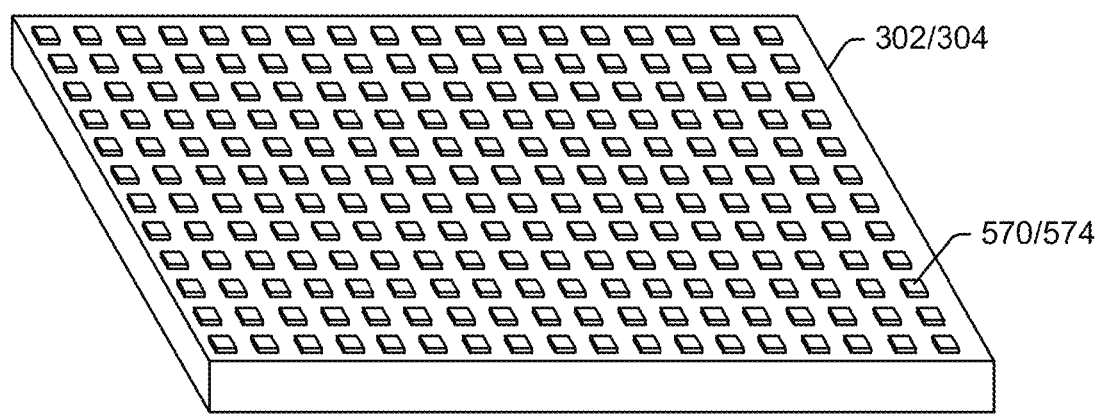
FIG. 10C depicts an example pattern of bond pads on a planar surface of a semiconductor die.

As has been discussed above, the control die 304 and the memory die 302 may be bonded together. Bond pads on each die 302, 304 may be used to bond the two dies together. FIG. 10C depicts an example pattern of bond pads on a planar surface of a semiconductor die. The semiconductor die could be memory die 302 or control die 304. The bond pads could be any of bond pads 570 or 574, as appropriate for the semiconductor die. There may be many more bond pads than are depicted in FIG. 10C. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 570, 574 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 302 and 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11:
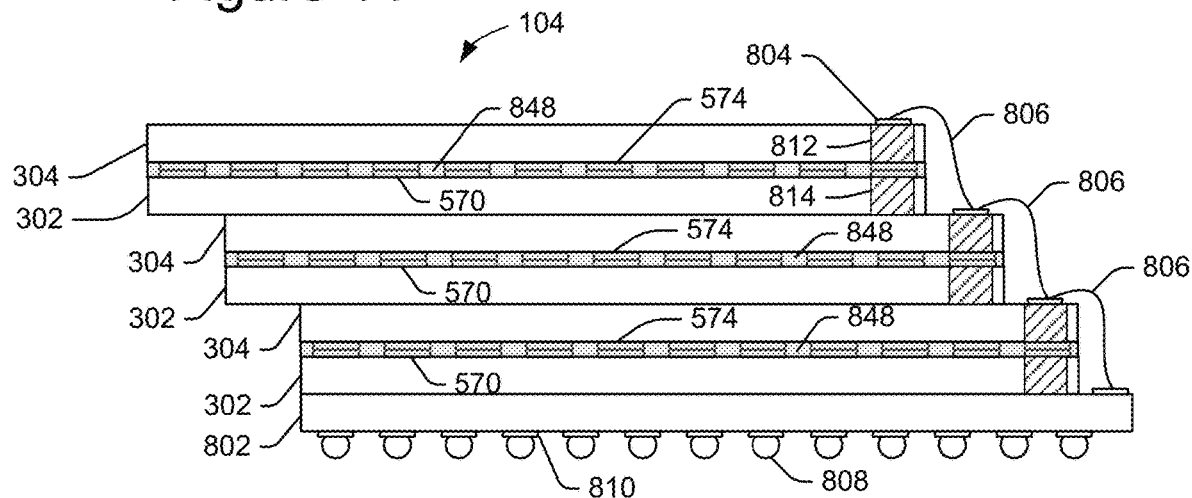
FIG. 11 depicts a side view of an embodiment of an integrated memory assembly stacked on a substrate.

As noted herein, there may be more than one control die 304 and more than one memory die 302 in an integrated memory assembly 104. In some embodiments, the integrated memory assembly 104 includes a stack of multiple control die 304 and multiple memory die 302. FIG. 11 depicts a side view of an embodiment of an integrated memory assembly 104 stacked on a substrate 802. The integrated memory assembly 104 has three control die 304 and three memory die 302. Each control die 304 is bonded to one of the memory die 302. Some of the bond pads 570, 574, are depicted. There may be many more bond pads. A space between two dies 302, 304 that are bonded together is filled with a solid layer 848, which may be formed from epoxy or other resin or polymer. This solid layer 848 protects the electrical connections between the dies 302, 304, and further secures the dies together. Various materials may be used as solid layer 848, but in embodiments, it may be Hysol epoxy resin from Henkel Corp., having offices in California, USA.

The integrated memory assembly 104 may for example be stacked with a stepped offset, leaving the bond pads 804 at each level uncovered and accessible from above. Wire bonds 806 connected to the bond pads 804 connect the control die 304 to the substrate 802. A number of such wire bonds may be formed across the width of each control die 304 (i.e., into the page of FIG. 8A).

A through silicon via (TSV) 812 may be used to route signals through a control die 304. A through silicon via (TSV) 814 may be used to route signals through a memory die 302. The TSVs 812, 814 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

In regard to one embodiment of the implementation depicted in FIG. 11, the various depicted TSV 812 and 814, connected to the bond pads 804 and wire bonds 806, may be used so that multiple control die 304 can communicate with each other and multiple control die 304 can transmit data between each other so, for example, a first control die can read data from its bonded memory die, transfer that data (after some optional processing) to a second control and the second control die can program that data into the memory die bonded to the second control die.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package. The solder balls 808 may form a part of the interface between the integrated memory assembly 104 and memory controller 102.

In the embodiment of FIG. 11, the memory dies 302 and the control dies 304 are arranged as pairs. That is, each memory die 302 is bonded to and in communication with a corresponding/matching/paired control die.

Figure 12:
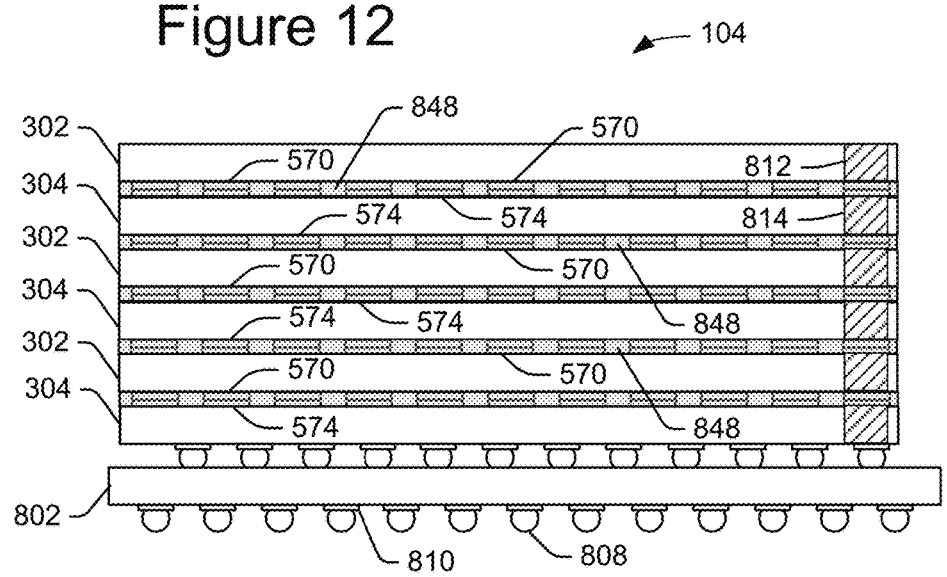
FIG. 12 depicts a side view of an embodiment of an integrated memory assembly stacked on a substrate.

FIG. 12 depicts a side view of an embodiment of an integrated memory assembly 104 stacked on a substrate 802. The integrated memory assembly 104 has three control die 304 and three memory die 302. In this example, each control die 304 is bonded to at least one memory die 302. Optionally, a control die 304 may be bonded to two memory die 302. For example, two of the control die 304 are bonded to a memory die 302 above the control die 304 and a memory die 302 below the control die 304.

Some of the bond pads 570, 574 are depicted. There may be many more bond pads. A space between two dies 302, 304 that are bonded together is filled with a solid layer 848, which may be formed from epoxy or other resin or polymer. In contrast to the example in FIG. 11, the integrated memory assembly 104 in FIG. 12 does not have a stepped offset. A through silicon via (TSV) 812 may be used to route signals through a memory die 302. A through silicon via (TSV) 814 may be used to route signals through a control die 304.

In regard to one embodiment of the implementation depicted in FIG. 12, the various depicted TSV 812 and 814 may be used so that multiple control die 304 can communicate with each other and multiple control die 304 can transmit data between each other so, for example, a first control die can read data from its bonded memory die, transfer that data (after some optional processing) to a second control and the second control die can program that data into the memory die bonded to the second control die.

Solder balls 808 may optionally be affixed to contact pads 810 on a lower surface of substrate 802. The solder balls 808 may be used to electrically and mechanically couple the integrated memory assembly 104 to a host device such as a printed circuit board. Solder balls 808 may be omitted where the integrated memory assembly 104 is to be used as an LGA package.

Figure 13:
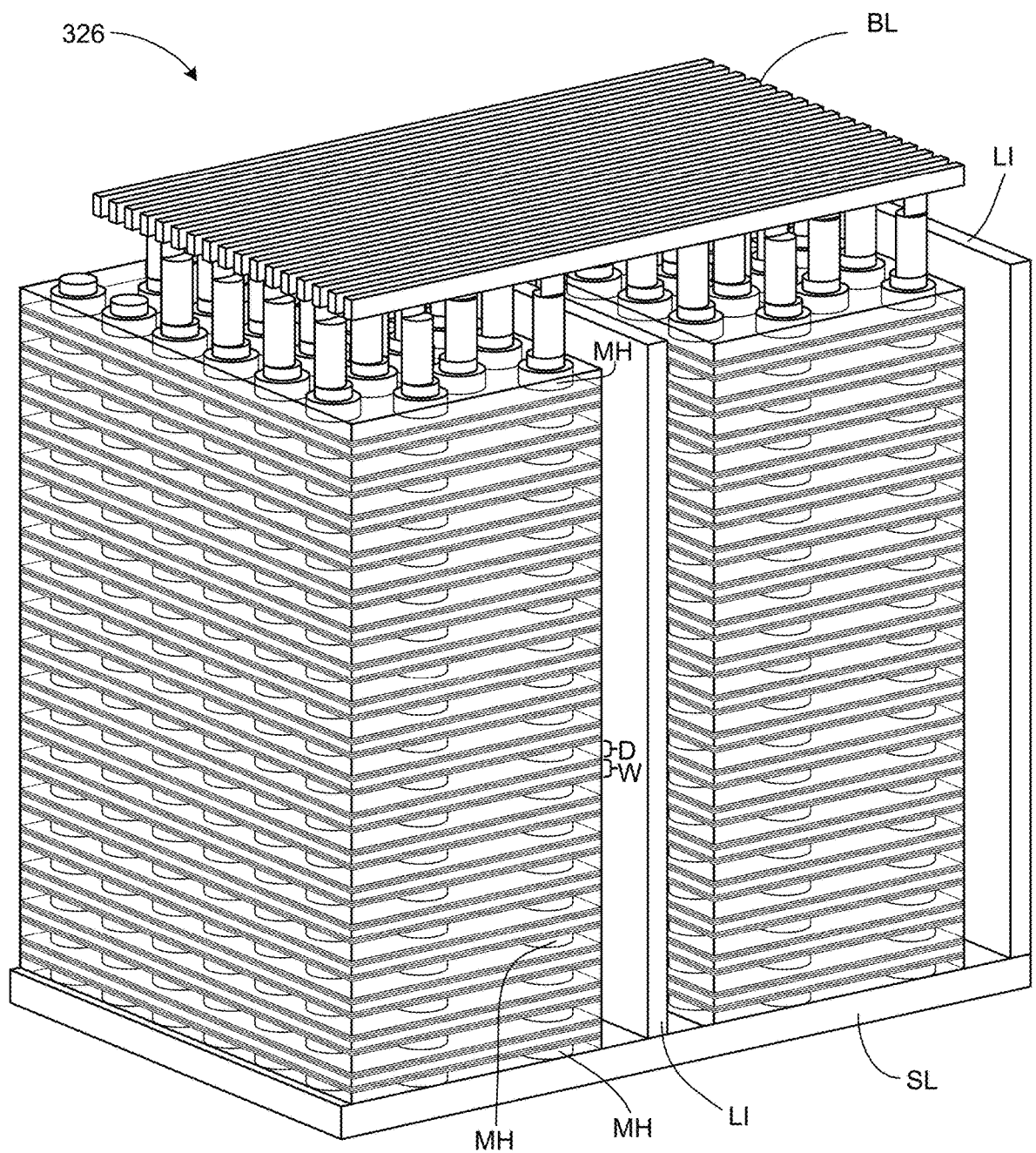
FIG. 13 is a perspective view of a portion of one example embodiment of a monolithic three dimensional memory array.

FIG. 13 is a perspective view of a portion of one example embodiment of a monolithic three dimensional memory array that can comprise memory structure 326, which includes a plurality non-volatile memory cells. For example, FIG. 13 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 913, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data. One example of a suitable memory structure 326 is described in U.S. Pat. No. 10,553,298, incorporated herein by reference in its entirety.

Figure 14:
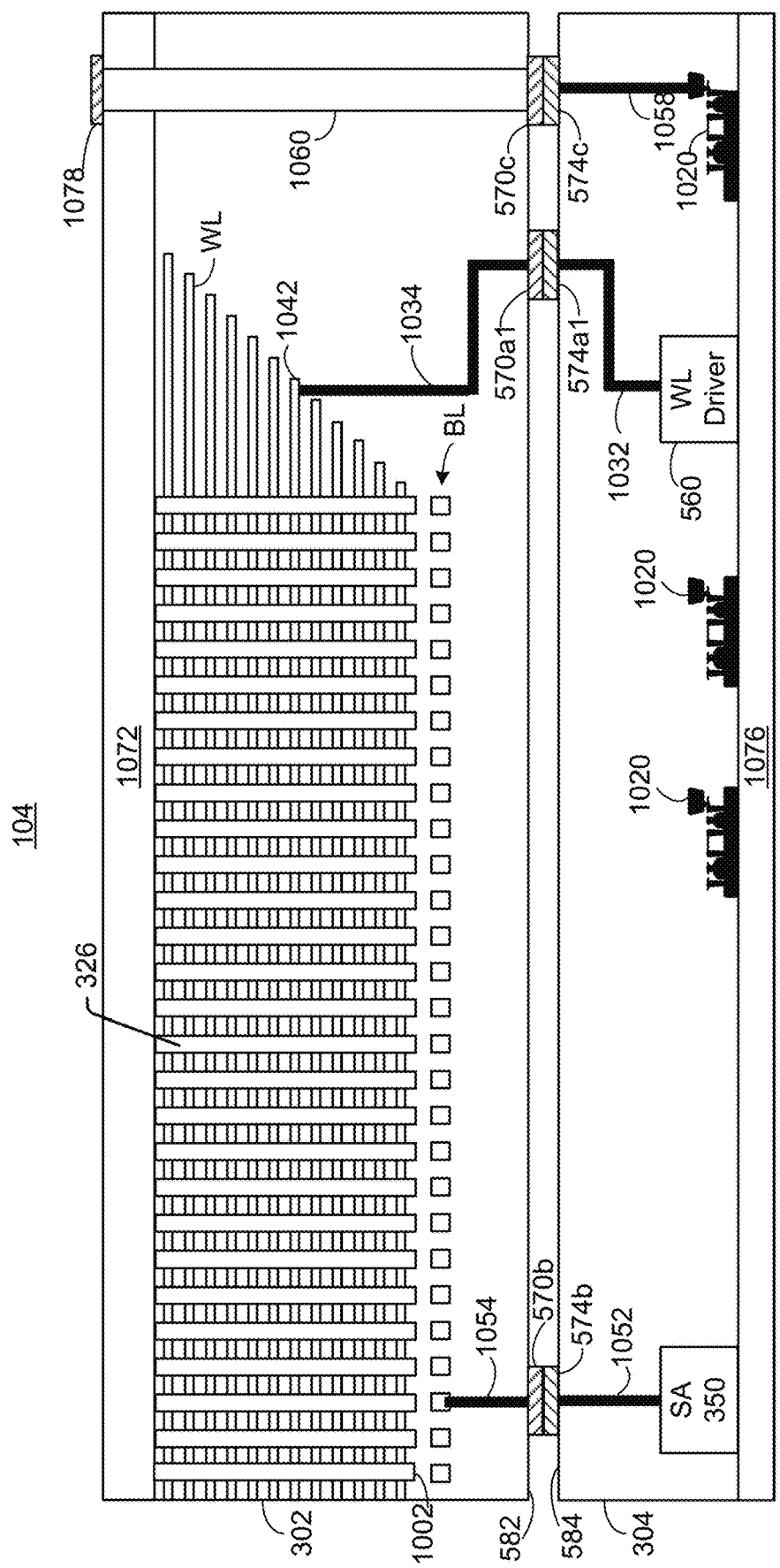
FIG. 14 depicts one embodiment of an integrated memory assembly.

FIG. 14 is a diagram of one embodiment of an integrated memory assembly 104. In an embodiment depicted in FIG. 14, memory die 302 is bonded to control die 304. This bonding configuration is similar to an embodiment depicted in FIG. 8. Note that although a gap is depicted between the pairs of adjacent dies, such a gap may be filled with an epoxy or other resin or polymer. FIG. 14 shows additional details of one embodiment of pathways 352.

The memory die includes a memory structure 326. Memory structure 326 is adjacent to substrate 1072 of memory die 302. In some embodiments, substrate 1072 is formed from a portion of a silicon wafer. In this example, the memory structure 326 include a three-dimensional memory array. The memory structure 326 has a similar structure as the example depicted in FIG. 13. There are a number of word line layers (WL), which are separated by dielectric layers. The dielectric layers are represented by gaps between the word line layers. Thus, the word line layers and dielectric layers form a stack. There may be many more word line layers than are depicted in FIG. 14. As with the example of FIG. 13, there are a number of columns that extend through the stack. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 10A) provide voltages to other word lines. Thus, there are additional bond pad 574a, 570a in addition to bond pads 574a1, 570a1. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310. In some embodiments, sense amplifiers 350, word line driver(s) 560, and/or other circuitry 1020 comprise CMOS circuits.

There is an external signal path that allows circuitry on the control die 304 to communicate with an entity external to the integrated memory assembly 104, such as memory controller 102. Therefore, circuitry 1020 on the control die 304 may communicate with, for example, memory controller 102. Optionally, circuitry on the control die 304 may communicate with, for example, host 120. The external pathway includes via 1058 in control die 304, bond pad 574c, bond pad 570c, through silicon via (TSV) 1060, and external pad 1078. The TSV 1060 extends through substrate 1072.

The TSV 1060, may be formed before, during or after formation of the integrated circuits in the semiconductor dies 302, 304. The TSV may be formed by etching holes through the wafers. For example, holes may be etched through substrate 1072. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to the embodiment depicted in FIG. 14 are possible. One modification is for sense amplifiers 350 to be located on memory die 302.

Figure 15:
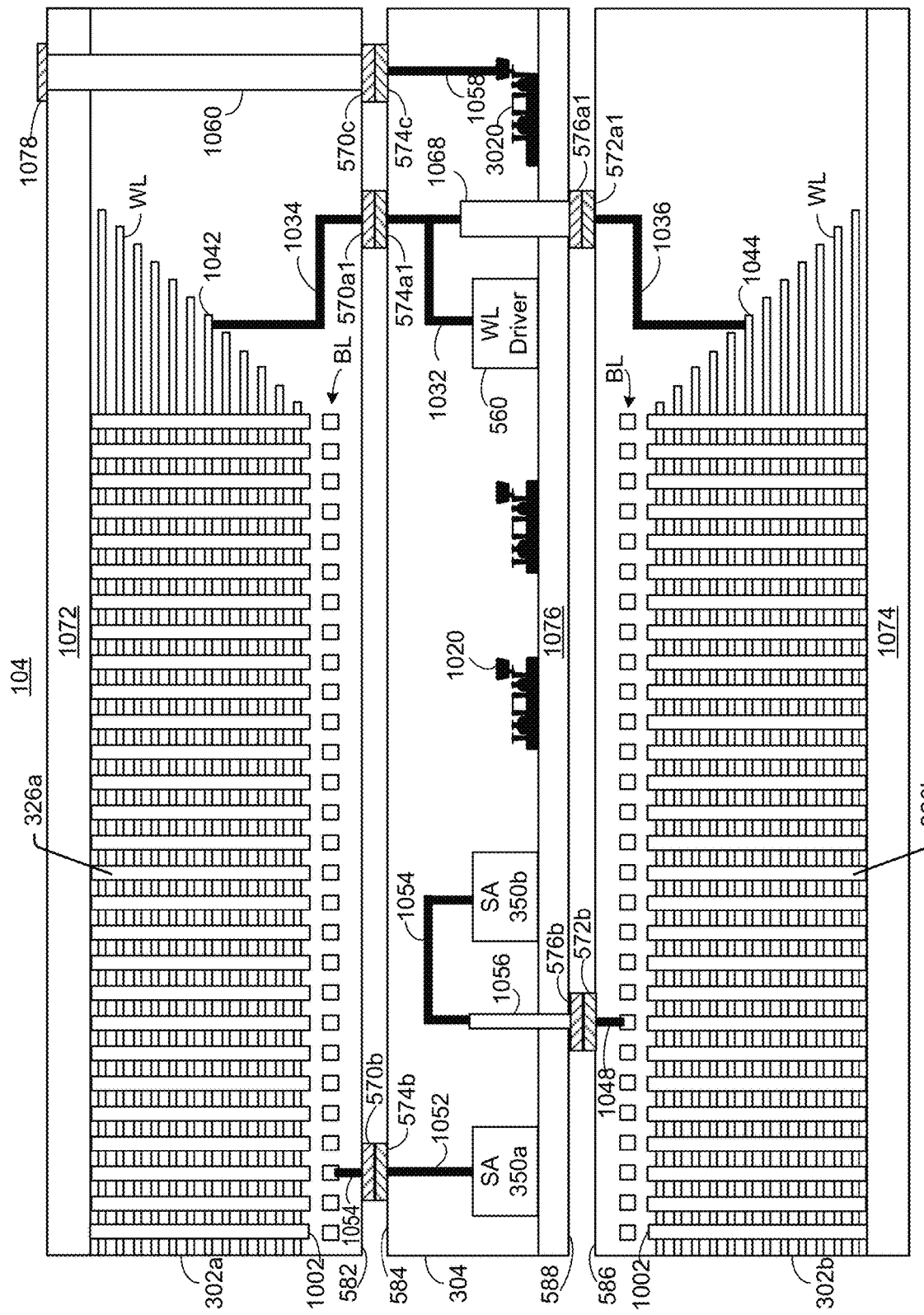
FIG. 15 depicts one embodiment of an integrated memory assembly in which one control die controls two memory die.

FIG. 15 depicts one embodiment of an integrated memory assembly 104. This bonding configuration is similar to an embodiment depicted in FIG. 8. The configuration in FIG. 15 adds an extra memory die relative to the configuration in FIG. 14. Hence, similar reference numerals are used for memory die 302a in FIG. 15, as were used for memory die 302 in FIG. 14. In an embodiment depicted in FIG. 15, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a1, bond pad 572a1, and conductive pathway 1036. Other word line drivers (not depicted in FIG. 10B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048.

Numerous modifications to the embodiment depicted in FIG. 10B are possible. One modification is for sense amplifiers 350a to be located on first memory die 302a, and for sense amplifiers 350b to be located on second memory die 302b.

Figure 16:
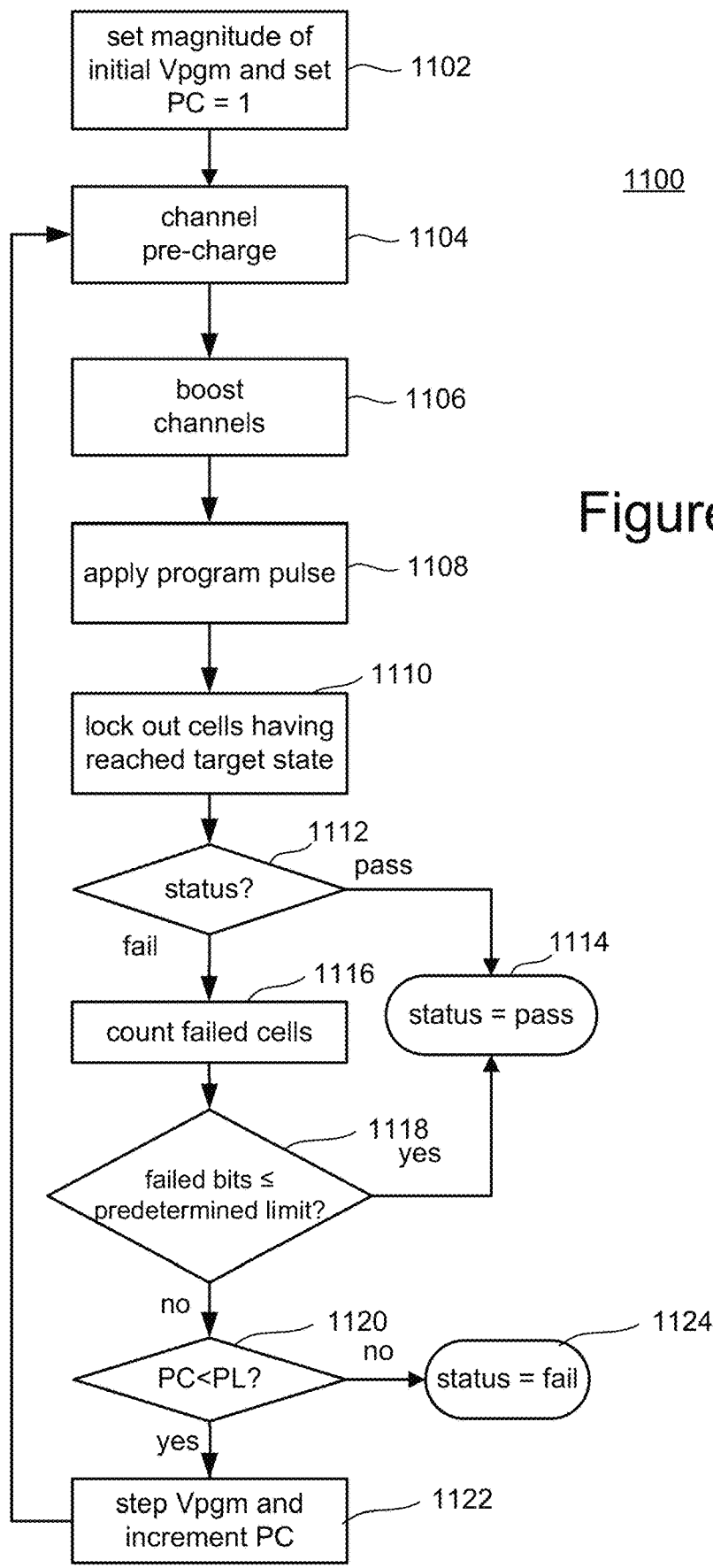
FIG. 16 is a flowchart describing one embodiment of a process for programming non-volatile memory cells organized into a memory array on a memory die.

FIG. 16 is a flowchart describing one embodiment of a process 1100 for programming NAND strings of memory cells. In one example embodiment, the process of FIG. 16 is performed on integrated memory assembly 104 using the control circuitry 310 discussed above. For example, the process of FIG. 16 can be performed at the direction of state machine 312. In one embodiment, process 1100 is used to program a codeword into memory structure 326. The process of FIG. 16 is performed by control die 104 to program memory cells on the memory die. In one embodiment, the process of FIG. 16 is performed at the direction of state machine 312.

In many implementations, the magnitude of the program pulses is increased with each successive pulse by a predetermined step size. In step 1102 of FIG. 11, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1104 the control die will pre-charge channels of NAND strings that include memory cells connected to the selected word line that are to be inhibited from programming.

In step 1106, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1108, a program pulse of the program signal Vpgm is applied to the selected word line (the word line selected for programming) by the control die. If a memory cell on a NAND string should be programmed, then the corresponding bit line is biased at a program enable voltage, in one embodiment. Herein, such a NAND string is referred to as a "selected NAND string."

In step 1108, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1110, memory cells that have reached their target states are locked out from further programming by the control die. Step 1110 may include performing verifying at one or more verify reference levels. In one embodiment, the verification process is performed by testing whether the threshold voltages of the memory cells selected for programming have reached the appropriate verify reference voltage. In step 1110, a memory cell may be locked out after the memory cell has been verified (by a test of the Vt) that the memory cell has reached its target state.

If, in step 1112, it is determined that all of the memory cells have reached their target threshold voltages (pass), the programming process is complete and successful because all selected memory cells were programmed and verified to their target states. A status of "PASS" is reported in step 1114. Otherwise if, in step 1112, it is determined that not all of the memory cells have reached their target threshold voltages (fail), then the programming process continues to step 1116.

In step 1116, the memory system counts the number of memory cells that have not yet reached their respective target threshold voltage distribution. That is, the system counts the number of memory cells that have, so far, failed to reach their target state. This counting can be done by state machine 312, memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1118, it is determined whether the count from step 1116 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1114. In this situation, enough memory cells programmed correctly such that the few remaining memory cells that have not been completely programmed can be corrected using ECC during the read process. In some embodiments, the predetermined limit used in step 1118 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1120 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1124. If the program counter PC is less than the program limit value PL, then the process continues at step 1122 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1122, the process loops back to step 1104 and another program pulse is applied to the selected word line (by the control die) so that another iteration (steps 1104-1122) of the programming process of FIG. 16 is performed.

At the end of a successful programming process, the threshold voltages of the memory cells should be within one or more distributions of threshold voltages for programmed memory cells or within a distribution of threshold voltages for erased memory cells, as appropriate. FIG. 17 illustrates example threshold voltage distributions for the memory array when each memory cell stores three bits of data. Other embodiments, however, may use other data capacities per memory cell (e.g., such as one, two, four, or five bits of data per memory cell). FIG. 17 shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 17 shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 17 also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 17 also shows Vev, which is a voltage level to test whether a memory cell has been properly erased.

In one embodiment, known as full sequence programming, memory cells can be programmed from the erased data state Er directly to any of the programmed data states A-G using the process of FIG. 16. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 17 represent the full sequence programming. In some embodiments, data states A-G can overlap, with control die 304 and/or memory controller 102 relying on error correction to identify the correct data being stored.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 17) or verify operation (e.g. see verify target levels VvA, VvB, VvC, VvD, VvE, VvF, and VvG of FIG. 17) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 18 depicts threshold voltage distributions when each memory cell stores four bits of data. FIG. 18 depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. When using four bits per memory cell, the memory can be programmed using the full sequence programming discussed above, or multi-pass programming processes (e.g., such as the processes discussed below or others known in the art).

Figure 19A:
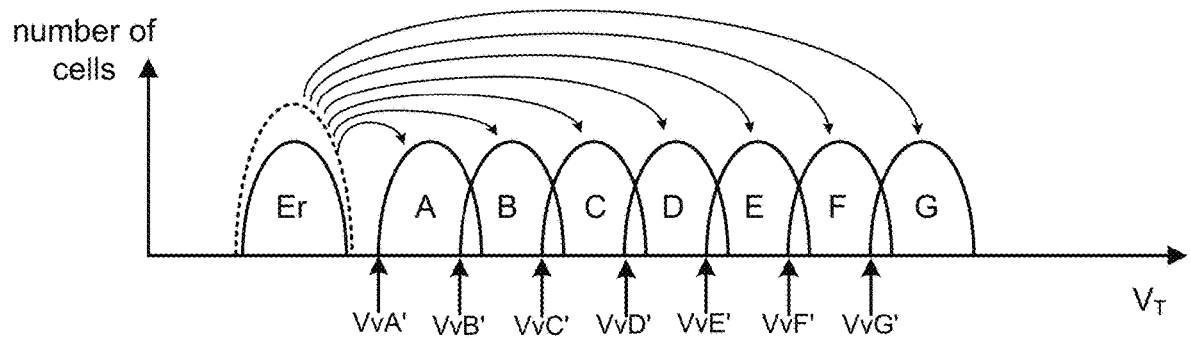
FIGS. 19A and 19B depict threshold voltage distributions for a population of non-volatile memory cells during a process for programming.
Figure 19B:
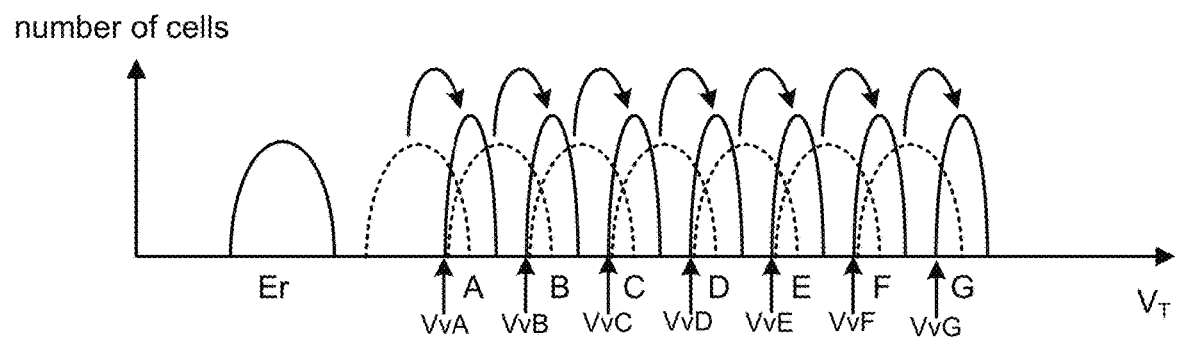

FIGS. 19A and 19B described one example of a multi-pass programming process, referred to a Foggy-Fine Programming. FIG. 19A depicts the first pass of the multi-pass programming process, which includes programming the memory cells from the erased state (Er) to any of the programmed data states A-G, similar to full sequence programming. However, rather than using the standard verify reference voltages (e.g., VvA, VvB, VvC, VvD, VvE, VvF, and VvG), the process of FIG. 19A uses an alternate set of verify reference voltages (e.g., VvA', VvB', VvC', VvD,' VvE', VvF', and VvG') that are each slightly lower than the corresponding standard verify reference voltage. Thus, the threshold voltages of FIG. 19A can be thought of as intermediate threshold voltage distributions (or intermediate data states) that are at lower voltages than the threshold voltages of FIG. 17.

FIG. 19B depicts the second (and last) pass of the multi-pass programming process, which includes programming the memory cells to tighten the threshold distributions. Thus, the memory cells are programmed from the intermediate threshold voltage distributions (or intermediate data states) of FIG. 19A to the final or target threshold voltage distributions (or data states) of FIG. 19B using the standard verify reference voltages (e.g., VvA, VvB, VvC, VvD, VvE, VvF, and VvD). FIG. 19A is referred to as the Foggy pass and FIG. 19B as the Fine Pass. In one embodiment, the Foggy pass of FIG. 19A is performed for a given word line, followed by the Foggy pass for the next word line. The Foggy pass for the next word line could give rise to interference for the given word line, thereby widening the intermediate threshold voltage distributions, which could lead to errors when reading the data. However, the Fine pass of FIG. 19B is subsequently performed after Foggy pass for the next word line, removing or reducing the effects of interference from the next word line. Both passes of the multi-pass programming process of FIGS. 19A and 19B can be implemented using the process of FIG. 16.

FIGS. 20A-20I disclose a multi-pass programming process for programming memory cells of memory structure 326. The process of FIGS. 20A-20I is a three pass programming process. All three passes of the multi-pass programming process of FIGS. 20A-20I can be implemented using the process of FIG. 16. Prior to the first step, the memory cells will be erased so that they are in the erase threshold distribution of state Er.

The process of FIGS. 20A-20I assumes that each memory cell stores three bits of data, with each bit being in a different page. The first bit of data (the leftmost bit) is associated with the first page. The middle bit is associated with the second page. The rightmost bit is associated with the third page. In one example embodiment, the correlation of data states to data is as follows: Er=111, A=110, B=101, C=100, D=011, E=010, F=001 and G=000. However, other embodiments can use other data encoding schemes.

Figure 20A:
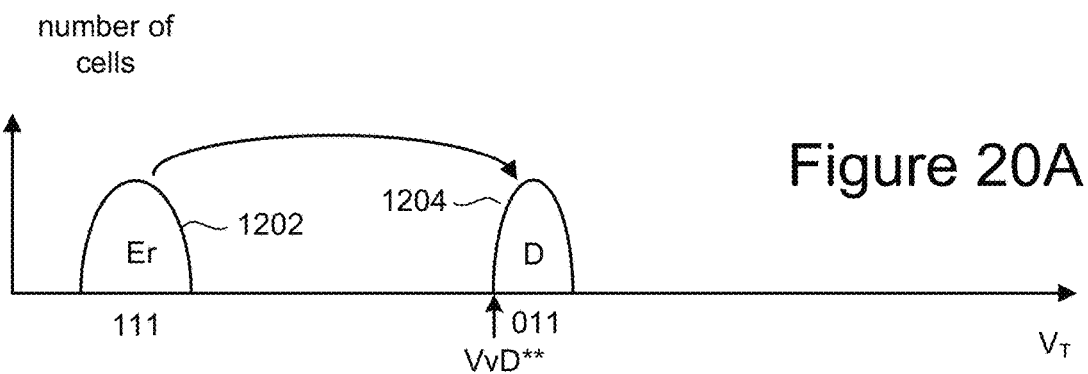
Figure 20B:
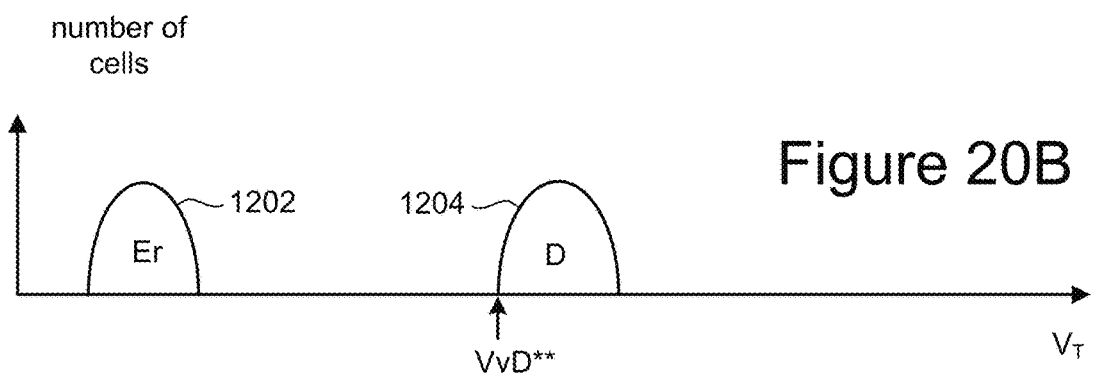

When programming the first page (as described in FIG. 20A), if the bit is to be data "1" then the memory cell will stay in state Er (threshold voltage distribution 1202). If the bit is to be data "0" then the memory cell is programmed to state D (threshold voltage distribution 1204). After adjacent memory cells (e.g., memory cells on an adjacent word line) are programmed (optional), capacitive coupling between adjacent floating gates may cause the state D to widen as depicted in FIG. 20B. State Er may also widen, but there is sufficient margin between Er and A to ignore the effect. More information about capacitive coupling between adjacent floating gates can be found in U.S. Pat. Nos. 5,867,429 and 6,657,891, both of which are incorporated herein by reference in their entirety.

Figure 20C:
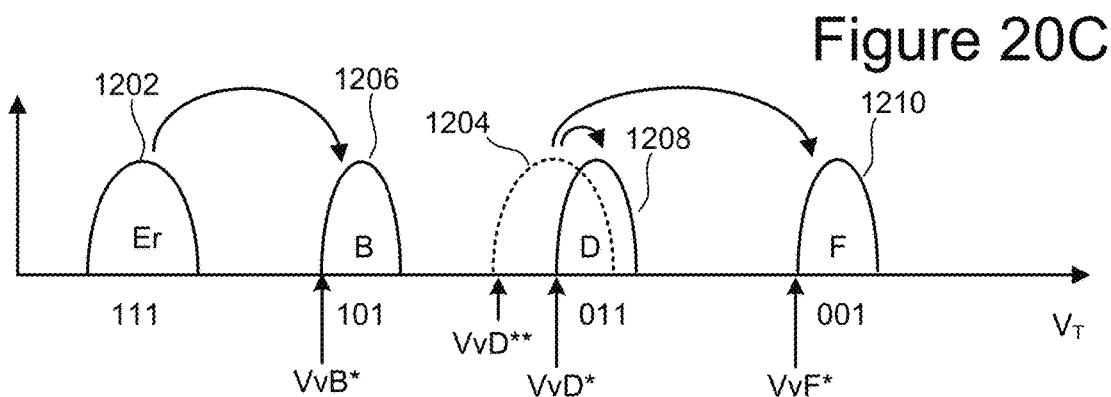

When programming the second page during the second pass (see FIG. 20C), if the memory cell is in data state Er and the second page bit is data "1" then the memory cell stays in data state Er. In some embodiments, the programming process for the second page will tighten threshold voltage distribution 1202 to a new Er. If the memory cell was in data state Er and the data to be written to the second page is "0", then the memory cell is moved to state B (threshold voltage distribution 1206). At this time in the programming process, data state B has a verify point (lowest voltage) of VvB*. If the memory cell was in data state D and the data to be written to the memory cell is "1" then the memory cell remains in D. However, state D is tightened by moving the memory cells from threshold voltage distribution 1204 to threshold voltage distribution 1208 for state D, as depicted in FIG. 20C. Threshold voltage distribution 1208 has a verify point of VvD* (as compared to VvD of threshold voltage distribution 1204). If the memory cell is in state D and the data to be written to the second page is a "0" then the memory cell has its threshold voltage moved to state F (threshold voltage distribution 1210**), with a verify point of VvF*.

Figure 20D:
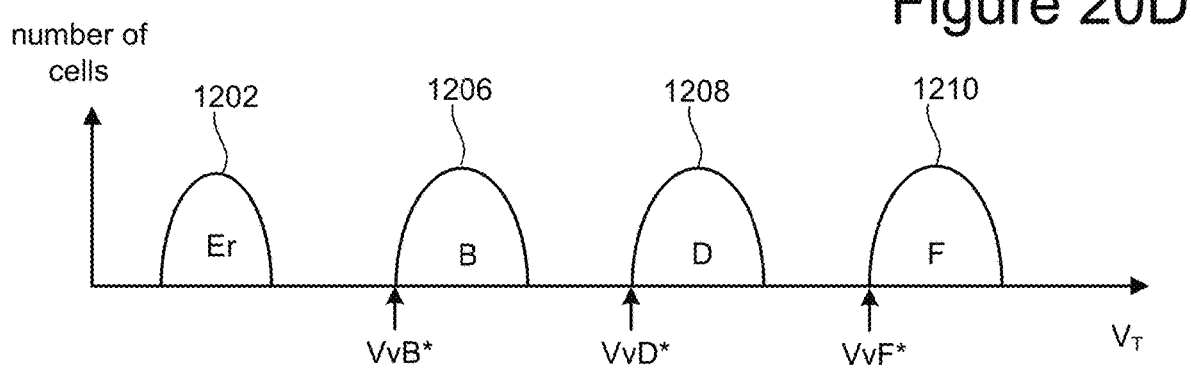

After the adjacent memory cells are programmed (optional), the states B, D and F are widened due to the floating gate to floating gate coupling, as depicted by threshold voltages distributions 1206, 1208 and 1210 of FIG. 20D. In some cases, state Er may also widen.

FIGS. 20E, 20F, 20G and 20H depict the programming of the third page during the third pass of the programming process. While one graph can be used to show the programming, the process is depicted in four graphs for visibility reasons. After the second page has been programmed, the memory cells are either in states Er, B, D or E. FIG. 20E shows the memory cells that are state Er being programmed for the third page. FIG. 20F shows the memory cells that are state B being programmed for the third page. FIG. 20G shows the memory cells that are in state D being programmed for the third page. FIG. 20H shows the memory cells that are in state E being programmed for the third page. FIG. 20I shows the threshold voltage distributions after the processes of FIGS. 20E, 20F, 20G and 20H have been performed on the population of memory cells (concurrently or serially). In one embodiment, the process of FIGS. 20E, 20F, 20G and 20H are performed on the population of memory cells using the process of FIG. 16.

If the memory cell is in state Er and the third page data is "1" then the memory cell remains at state Er. If the data for the third page is "0" then the threshold voltage for the memory cell is raised to be in state A, with a verify point of VvA (see FIG. 20E).

If the memory cell is in state B and the data to be written in the third page is "1", then the memory cell will remain in state B (see FIG. 20F). However, some programming will be performed to tighten the threshold distribution 1206 to a new state B with a verify point of VvB volts. If the data to be written to the third page is "0," then the memory cell will be programmed to state C, with a verify point of VvC volts (see FIG. 20F).

If the memory cell is in state D and the data to be written to the third page is "1" then the memory cell will remain in state D (see FIG. 20G). However, some programming will be performed so that threshold voltage distribution 1208 will be tightened to new state D with a verify point of VvD. If the memory cell is in state D and the data to be written to the third page is "0" then the memory cell will have its threshold voltage raised to be in state E, with a verify point of VvE (see FIG. 20G).

If the memory cell is in state F and the data to be written to the third page is "1" then the memory cell will remain in state G (see FIG. 20H). However, there will be some programming so that the threshold voltage distribution 1210 is tightened to be in new state F, with a verify point at VvF.

If the third page data is "0" then the memory cell will have its threshold voltage programmed to state G, with a verify point at VvG. At the conclusion of the programming of the third page, the memory cell will be in one of the eight states depicted in FIG. 20I.

The programming processes described by FIGS. 16, 17, 18, 19A, 19B and 20A-20I are performed by control die 304 (e.g., performed by one or more control circuits on one or more control die 304) to program memory cells on memory die 302. In one embodiment, those programming processes are performed at the direction of state machine 312 (or other processor or microcontroller) using the other circuits of control circuitry 310.

Figure 21:
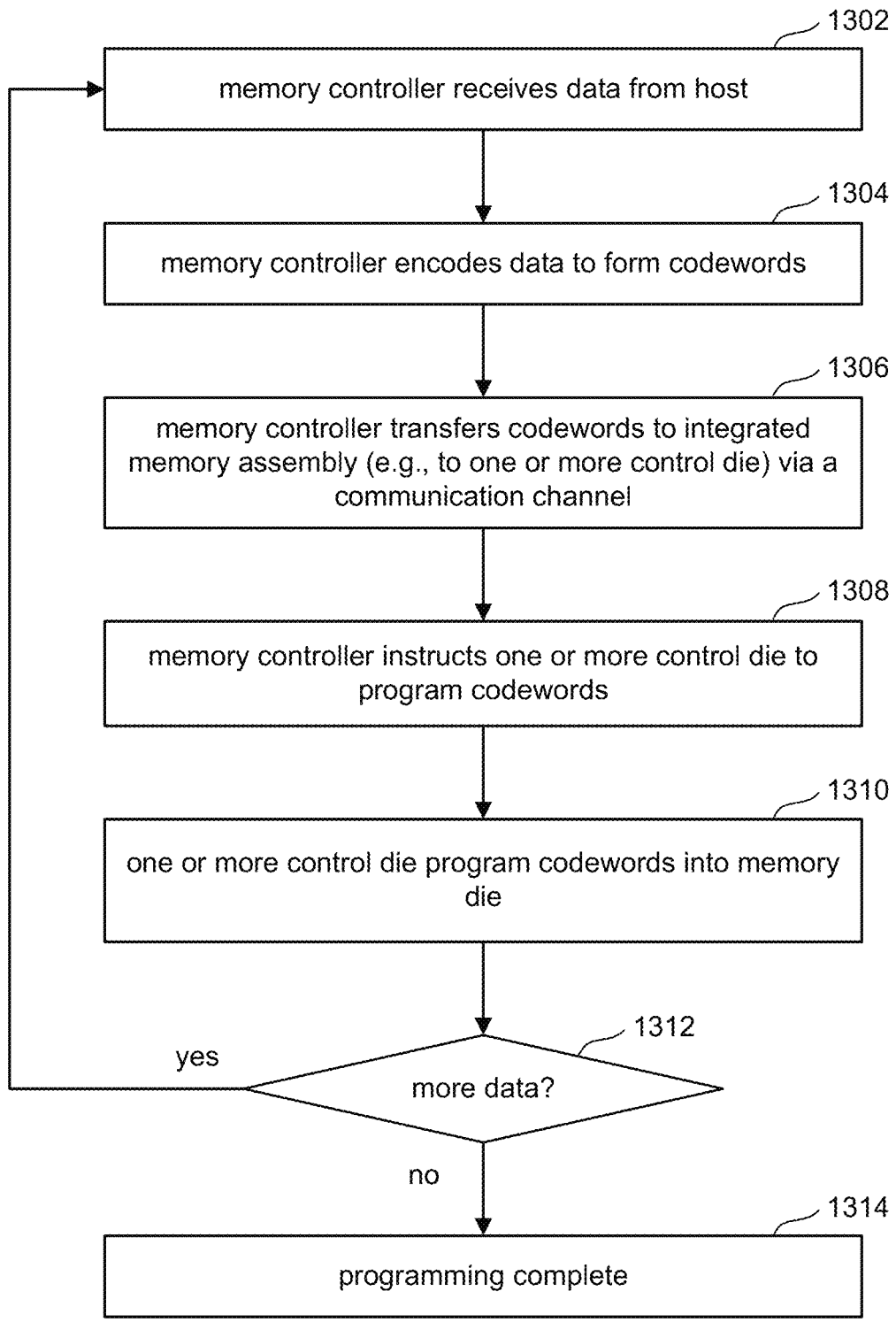
FIG. 21 is a flowchart describing one embodiment of a process for operating a storage system.

FIG. 21 is a flow chart describing one embodiment of a process performed by memory controller 102 to cause data to be programmed into memory cells on memory die 302. In step 1302, memory controller 102 receives data from host 120 via interface 130 (see FIG. 1). The data can be user data, which is data provided by the user of host 120. For example, if host 120 is a digital camera then the data may be all or part of a photograph. In step 1304, memory controller 102 encodes data to form one or more codewords. In this embodiment, memory controller 102 encodes data for ECC purposes, rather than control die 304. In step 1306, memory controller 102 transfers the codewords to integrated memory assembly 104 (e.g., to one or more control die 304) via a communication channel (e.g., a Toggle Mode Interface). In step 1308, memory controller 102 instructs the one or more control die 304 to program the codewords transferred in step 1306. In one embodiment, the instruction to perform the programming comprises sending one or more addresses and one or more commands via the communication channel (e.g., a Toggle Mode Interface—see memory controller interface 332). In step 1310, the one or more control die 304 program the codewords into one or more memory die 302. For example, one or more control die 304 perform the programming processes described by FIGS. 16, 17, 18, 19A, 19B and/or 20A-20I to program memory cells on one or more memory die 302. If there is more data to be programmed (step 1312), then the process of FIG. 21 loops back to step 1302; otherwise, programming is complete (step 1314).

Figure 22:
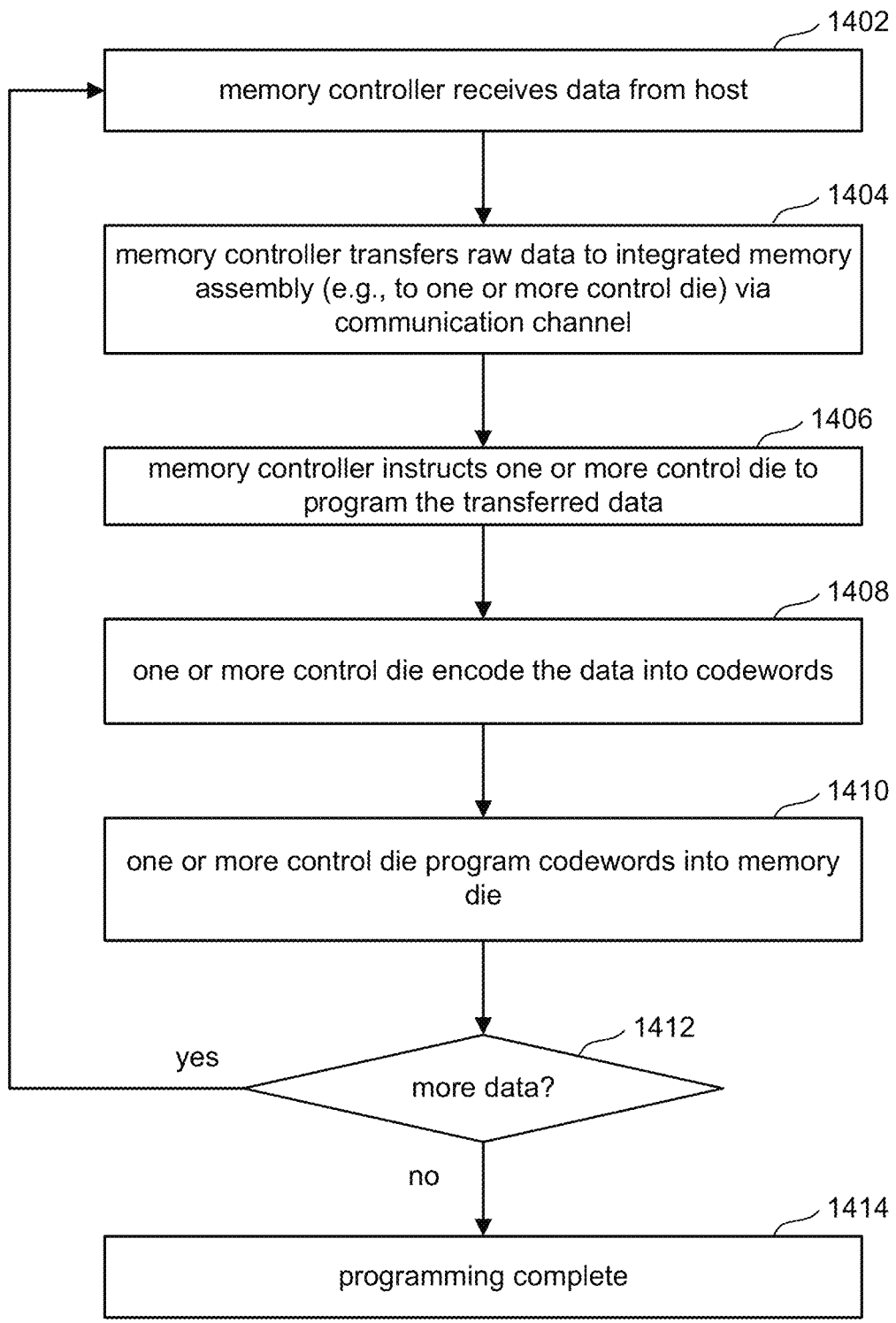
FIG. 22 is a flowchart describing one embodiment of a process for operating a storage system.

FIG. 22 is a flow chart describing another embodiment of a process performed by memory controller 102 to cause data to be programmed into memory cells on memory die 302. In the embodiment of FIG. 22, control die 304 encodes data for ECC purposes, rather than memory controller 102. In step 1402, memory controller 102 receives data from host 120 via interface 130 (see FIG. 1). The data can be user data. In step 1404, memory controller 102 transfers raw data (e.g., data not encoded with ECC information such as parity bits, etc.) to integrated memory assembly 104 (e.g., to one or more control die 304) via communication channel (e.g., a Toggle Mode interface). In step 1406, memory controller 102 instructs one or more control die 304 to program the transferred raw data into one or more memory die 302. In one embodiment, the instruction to perform the programming comprises sending one or more addresses and one or more commands via the communication channel (e.g., a Toggle Mode Interface—see memory controller interface 332). In step 1408, the one or more control die 304 encode the transferred data into one or more codewords using an ECC process (e.g., ECC engine 330, Encoder 380, etc.). In step 1420, the one or more control die 304 program the codewords into one or more memory die 302. For example, one or more control die 304 perform the programming processes described by FIGS. 16, 17, 18, 19A, 19B and/or 20A-20I to program memory cells on one or more memory die 302. If there is more data to be programmed (step 1412), then the process of FIG. 22 loops back to step 1402; otherwise, programming is complete (step 1414).

Figure 23:
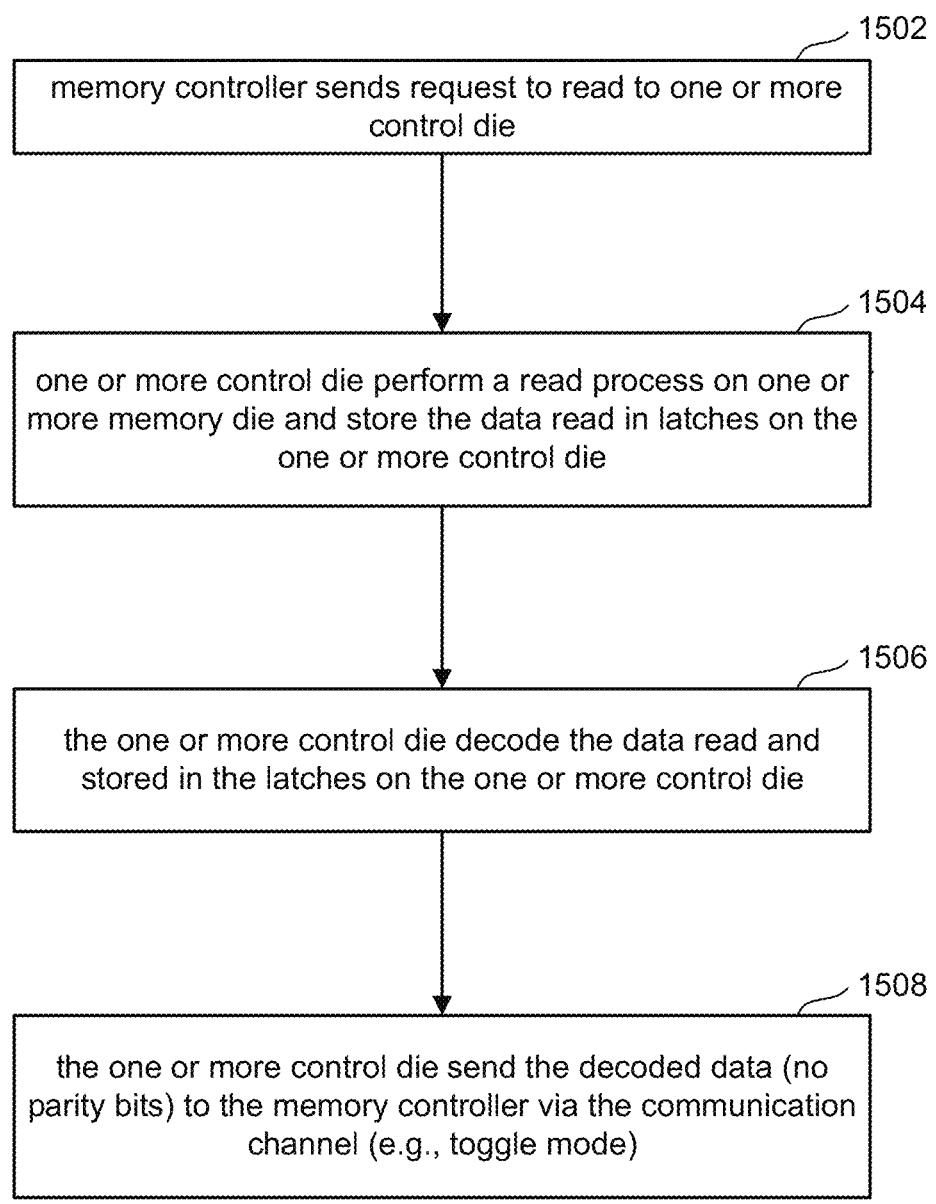
FIG. 23 is a flowchart describing one embodiment of a process for operating a storage system.

FIG. 23 is a flow chart describing one embodiment of a process performed by memory controller 102 to cause data to be read from memory cells on memory die 302. In step 1502, memory controller 102 sends a request to read to one or more control die 304. In one embodiment, the instruction to perform the reading comprises sending one or more addresses and one or more commands via the communication channel (e.g., a Toggle Mode Interface—see memory controller interface 332). In step 1504, one or more control die 304 perform a read process on one or more memory die 302 and store the data read in latches 360 on the one or more control die 302. In step 1506, the one or more control die 304 (e.g., decoder 390) decode the data read (as discussed above) and stored in the latches 360 on the one or more control die 304. In step 1508, the one or more control die 304 send the decoded data to memory controller 102 via the communication channel (e.g., a Toggle Mode Interface—see memory controller interface 332). In one embodiment, the one or more control die 304 send the decoded data bits but not the parity bits to memory controller 102 via the communication channel.

As discussed above, an on-chip-copy process is proposed that copies data from a first location on a memory die to a second location on the memory die without transferring the data to the memory controller. Since on-chip-copy avoids data transfers to the memory controller, the copy process is competed faster and uses less power due to no data transfer on the communication channel (e.g., a Toggle Mode Interface—see memory controller interface 332) between the memory controller 102 and integrated memory assembly 104. However, since memory systems traditionally do not have the ability to perform the decoding process at the memory die, the on-chip-copy process could result in the data accumulating errors. Therefore, it is proposed to add the on-chip-copy functionality to the control die 304 and leverage the decoder 390 on control die 304 such that the implementation of an on-chip-copy includes some level of decoding and fixing errors prior to programming the data being copied to the destination location.

Figure 24:
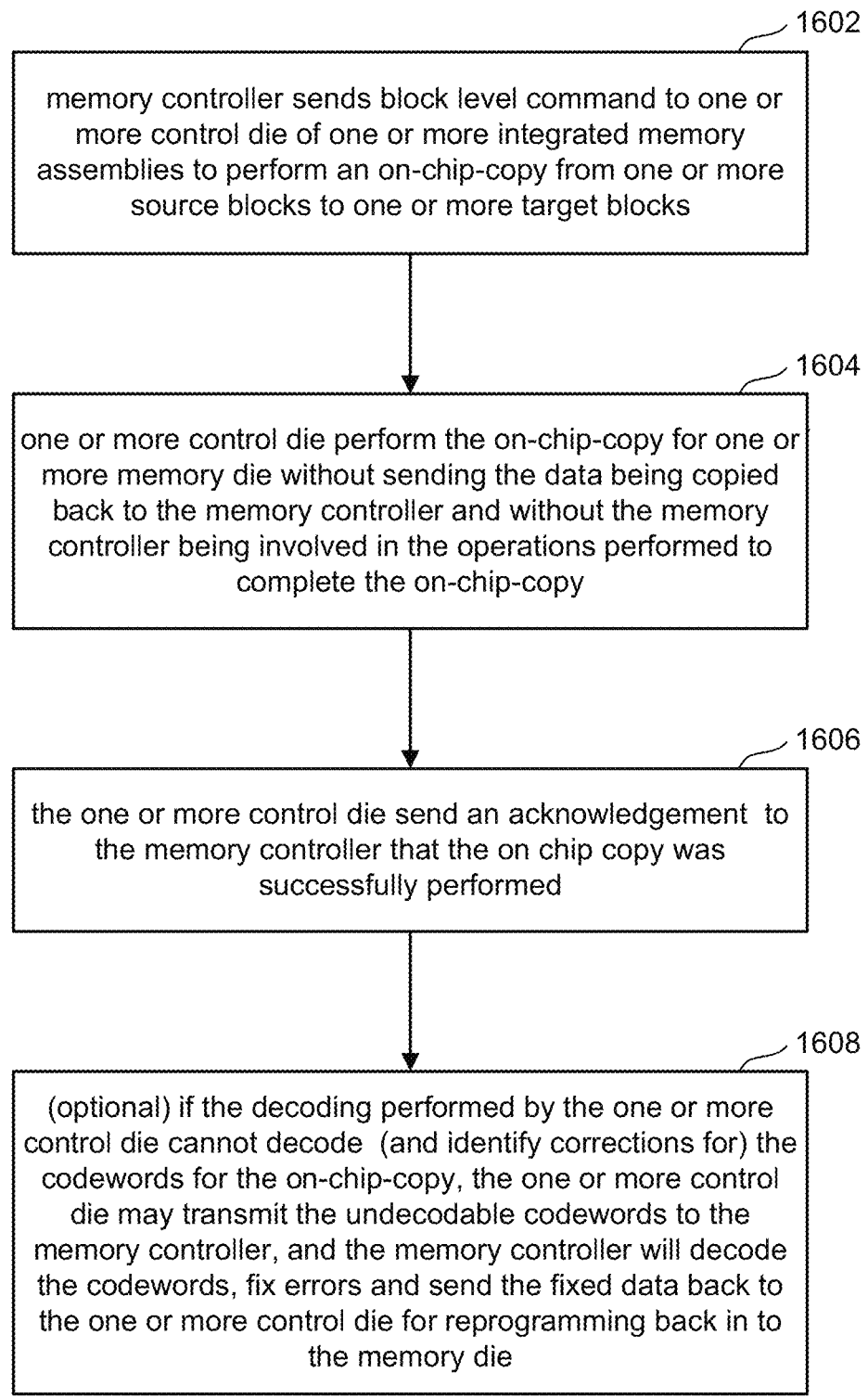
FIG. 24 is a flowchart describing one embodiment of a process for operating a storage system to perform an on chip copy operation.

FIG. 24 is a flow chart describing one embodiment of a process performed by memory controller 102 to cause an on-chip-copy operation to be performed by one or more integrated memory assemblies 104. In step 1602, memory controller 102 sends a block level command to one or more control die 304 of one or more integrated memory assemblies 104 to perform an on-chip-copy such that data is copied from one or more source blocks to one or more target blocks. Step 1602 is performed at the block level. That is, memory controller 102 sends one or more addresses of one or more blocks with the on-chip-copy command. In another embodiment, memory controller 102 send an address at a different level of granularity; for example, memory controller 102 can send an address of a page, a portion of a page, a portion of a block, a super block, or other unit of data. In one embodiment, the source blocks are on the same memory die as the target blocks. In another embodiment, the source blocks are on a different memory die than the target blocks; for example, by using a control die bonded to multiple memory die (e.g., see FIGS. 9 and 15) or by communicating data between control die bonded to different memory die (e.g., see FIGS. 11 and 12, and corresponding discussion above). In step 1604, one or more control die 304 perform the on-chip-copy for one or more memory die 302 without sending the data being copied back to the memory controller 102 and without the memory controller 102 being involved in the operations performed to complete the on-chip-copy. In step 1606, the one or more control die 304 send an acknowledgement to memory controller 102 that the on chip copy was successfully performed.

In step 1608 of FIG. 24, if the decoding performed by the one or more control die 304 cannot decode (and identify corrections for) the codewords for the on-chip-copy, the one or more control die 304 may transmit the undecodable codewords to memory controller 102, and memory controller 102 will decode the codewords (using a higher resolution decoder, as discussed above), fix errors and send the fixed data back to the one or more control die 304 for reprogramming back into the memory die. The fixed data sent back to the one or more control die 304 can be encoded with parity bits or can be raw data for the one or more control die 304 to encode. Step 1608 is optional; therefore, some embodiments do not include performing step 1608. When step 1608 is not performed, the one or more control die 304 perform the on-chip-copy for one or more memory die 302 without sending the data being copied back to the memory controller 102 and without the memory controller 102 being involved in the operations performed to complete the on-chip-copy.

Figure 25:
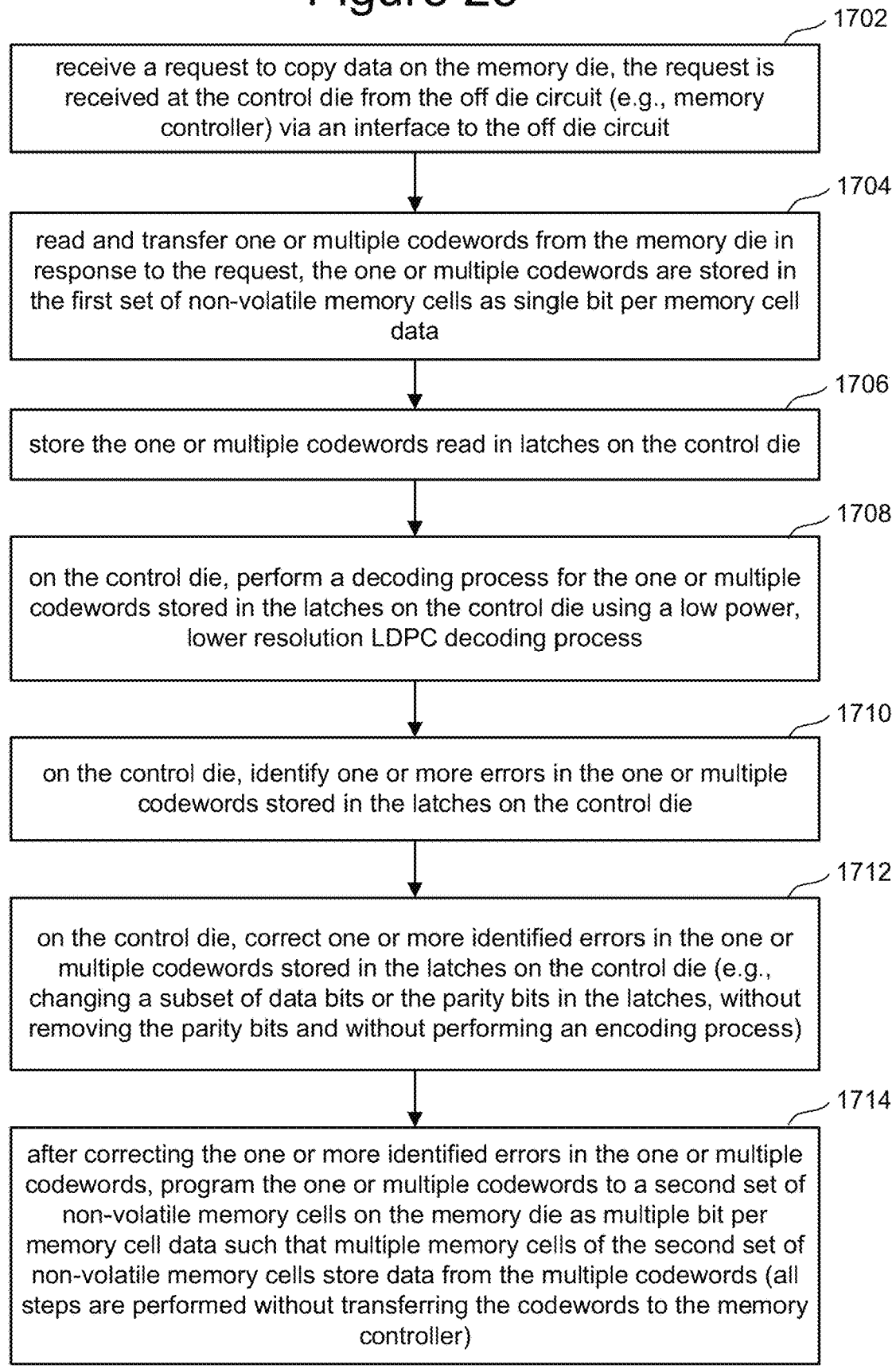
FIG. 25 is a flowchart describing one embodiment of a process for performing an on-chip-copy operation.

FIG. 25 is a flow chart describing one embodiment of a process performed by one or more integrated memory assemblies 104 to implement an on-chip-copy operation without sending the data being copied to memory controller 102 and without memory controller 102 being involved in the operations performed during the on-chip-copy. Thus, the process of FIG. 25 is one example embodiment of step 1604 of FIG. 24. In step 1702, one or more control die 304 of one or more integrated memory assemblies receive a request to copy data on one or more memory die 302. The request, which is for an on-chip-copy operation, is received at the one or more control die 304 from an off die circuit (e.g., memory controller 102) via an interface to the off die circuit, such as the communication channel discussed above (e.g., a Toggle Mode Interface—see memory controller interface 332).

In step 1704, the one or more control die 304 read and transfer one or more codewords from the one or more memory die 302 in response to the request. The one or more codewords are stored in a first set of non-volatile memory cells on the one or more memory die 302. In one embodiment, the one or more codewords are stored on the one or more memory die 302 as single bit per memory cell data. In another embodiment, the one or more codewords are stored on the one or more memory die 302 as multiple bit per memory cell data. The first set of non-volatile memory cells can all be part of the same block or across multiple blocks. The first set of non-volatile memory cells can all be on the same memory die or across multiple memory die. In step 1706, the one or more control die 304 store the one or multiple codewords transferred from the one or more memory die 302 in step 1704 in latches (e.g., latches 360) on the one or more control die 304. All of the codewords can be stored on one control die 304 or across multiple control die 304.

In step 1708, the one or more control die 304 perform a decoding process for the one or more codewords stored in the latches on the one or more control die using a low power, lower resolution LDPC decoding process. In one embodiment, step 1708 is performed entirely on the one or more control die 304. For example, the decoding process is performed by decoder 390 of ECC engine 330 on control die 304, as discussed above. In step 1710, the one or more control die 304 identify one or more errors in the one or multiple codewords stored in the latches 360. The errors in the codewords are identified as part of the decoding process, as discussed above. The process of decoding the codewords (see step 1708) does not require completion of the decoding as partial decoding may be sufficient to identify the errors. In one embodiment, step 1710 is performed entirely on the one or more control die 304.

In step 1712, the one or more control die 304 correct one or more identified errors in the one or multiple codewords stored in latches 360 on the one or more control die 302. In one embodiment, the correcting of errors comprises changing a subset of data bits in the latches and/or changing a subset of the parity bits in the latches, without removing the parity bits and without performing an encoding process. That is, in one embodiment the changes are made to the codewords stored in latches 360 rather than decoding the data, correcting the decoded data and re-encoding the corrected data. In one embodiment, corrected codewords are codewords that have been decoded and had identified errors fixed. If no errors were found, the result is still a corrected codeword. The process of decoding the codewords does not require completion of the decoding as partial decoding may be sufficient to identify the errors. In one embodiment, step 1712 is performed entirely on the one or more control die 304.

In step 1714, after correcting the one or more errors identified in the one or multiple codewords, the one or more control die 304 program the one or multiple codewords to a second set of non-volatile memory cells on the one or more memory die of one or more integrated memory assemblies. The system can use any of the programming processes discussed herein or known in the art. The second set of non-volatile memory cells are different than the first set of one or more memory cells such that the codewords are copied from one location on the one or more memory die 304 to a different location on the one or more memory die. In another embodiment, the codewords can be copied from a first location to the same location (thereby merely correcting the errors in the codewords). In one embodiment, the one or more control die 304 program the one or multiple codewords to the second set of non-volatile memory cells as single bit per memory cell data. In another embodiment, the one or more control die 304 program the one or multiple codewords to the second set of non-volatile memory cells as multiple bit per memory cell data such that all or a subset of the memory cells of the second set of non-volatile memory cells stores data from the multiple codewords. For example, in one embodiment each codewords stores a page of data and three codewords can be stored in the same memory cells as three bits per memory cell data with each memory cell storing one bit for each of the three codewords. In one embodiment, step 1712 is performed entirely by one or more control die 304 and one or more memory die 302, and not by any memory controller.

In one embodiment of step 1714, the second set of non-volatile memory cells are on the same die (or dies) as the first set of non-volatile memory cells. In another embodiment of step 1714, the second set of non-volatile memory cells are on one or more different die as the first set of non-volatile memory cells; for example, by using a control die bonded to multiple memory die (e.g., see FIGS. 9 and 15) or by communicating data between control die bonded to different memory die (e.g., see FIGS. 11 and 12, and corresponding discussion above).

In one embodiment, the process of FIG. 25 is used to perform an on-chip-copy at the block level, which includes one or more control circuits of one or more control die managing the copy of the entire block. Reading/decoding/programming is performed one word line after another (e.g. reading WL0 from 3 SLC blocks, decoding the 3 pages and programming to WL0 of a MLC block, then reading WL1 from 3 SLC blocks, decoding the 3 pages and programming to WL1 of the MLC block, . . . and so on till the last WL). This means programming 3 SLC blocks into 1 MLC block. An alternative order is programming 1 SLC block into 1/3 MLC block—i.e. taking 3 consecutive WLs from one SLC block and programming them to 1WL of the MLC block. This block level command reduces overhead from the memory controller, which does not have to micro manage all the operations of this pre-defined sequence.

In one embodiment, all steps of the process depicted in FIG. 25 are performed without transferring the codewords to memory controller 102. In one embodiment, a memory die 302 is paired with a corresponding control die 304 and all of the steps of the process depicted in FIG. 25 are performed by and on a pair of one control die 304 and its corresponding memory die 302.

Figure 26A:
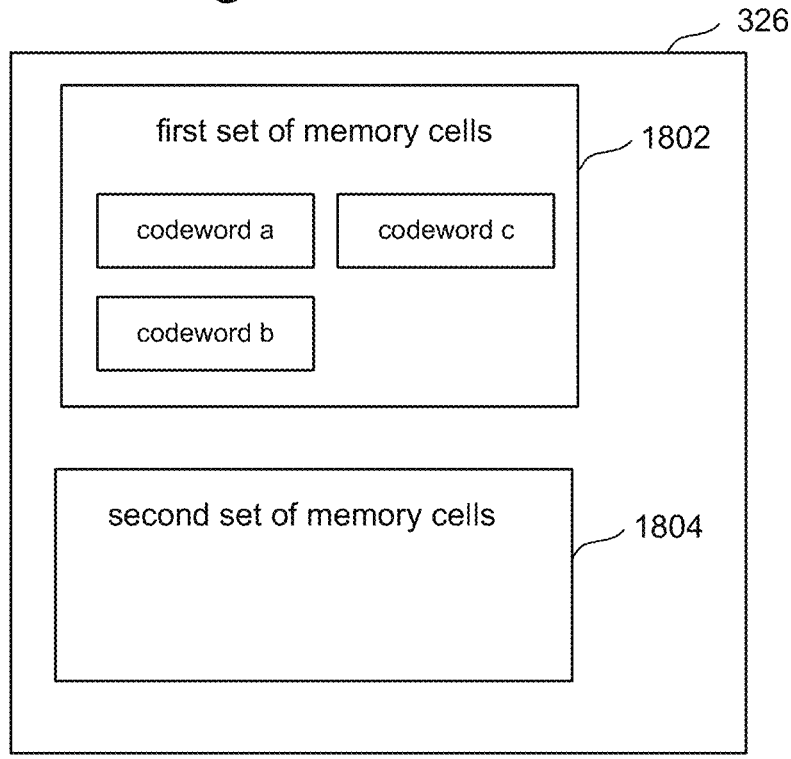
FIGS. 26A and 26B depicts a portion of a memory structure before and after an on-chip-copy operation.
Figure 26B:
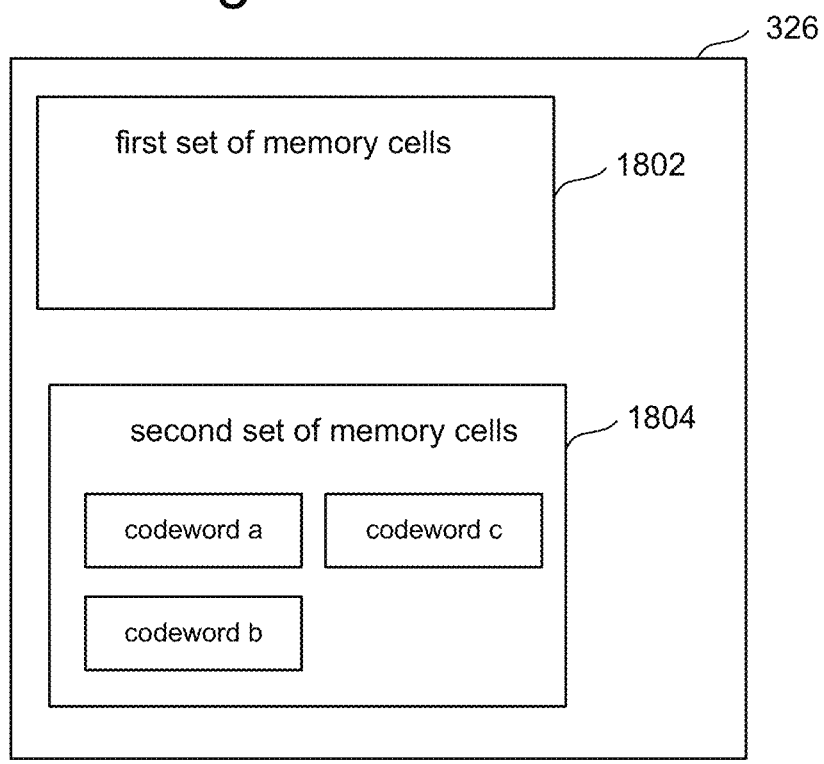

FIG. 26A depicts a portion of memory structure 326 before an on-chip-copy operation and FIG. 26B depicts the portion of memory structure 326 after the on-chip-copy operation for one embodiment of the on-chip-copy operation. That is, for one embodiment, FIG. 26A depicts memory structure 326 before the process of FIG. 25 and FIG. 26B depicts memory structure 326 after the process of FIG. 25. FIGS. 26A and 26B show memory structure 326 including a first set of non-volatile memory cells 1802 and a second set of non-volatile memory cells 1804. Prior to performing the process of FIG. 25, the first set of non-volatile memory cells 1802 store one or more codewords. For example, FIG. 26A depicts the first set of non-volatile memory cells 1802 storing codeword a, codeword b and codeword c. In one embodiment, codeword a, codeword b and codeword c are stored as single bit per memory cell data. In another embodiment, codeword a, codeword b and codeword c are stored as multiple bit per memory cell data. Codeword a, codeword b and codeword c can be stored in the same block or different blocks. Codeword a, codeword b and codeword c can be stored in the same memory cells or different memory cells.

After concluding the process of FIG. 25, the second set of non-volatile memory cells 1804 store the one or more codewords. For example, FIG. 26B depicts the second set of non-volatile memory cells 1804 storing codeword a, codeword b and codeword c. In one embodiment, codeword a, codeword b and codeword c are stored as single bit per memory cell data. In another embodiment, codeword a, codeword b and codeword c are stored as multiple bit per memory cell data. Codeword a, codeword b and codeword c can be stored in the same block or different blocks. Codeword a, codeword b and codeword c can be stored in the same memory cells or different memory cells.

Note that FIG. 26B shows the first set of non-volatile memory cells 1802 as being empty. In some embodiments, the first set of non-volatile memory cells 1802 are marked as having invalid data. In other embodiments, the first set of non-volatile memory cells 1802 are erased. In yet other embodiments, the first set of non-volatile memory cells 1802 would still store codeword a, codeword b and codeword c, but the version of the codewords stored are prior to the corrections performed in step 1712 of FIG. 25.

Figure 27A:
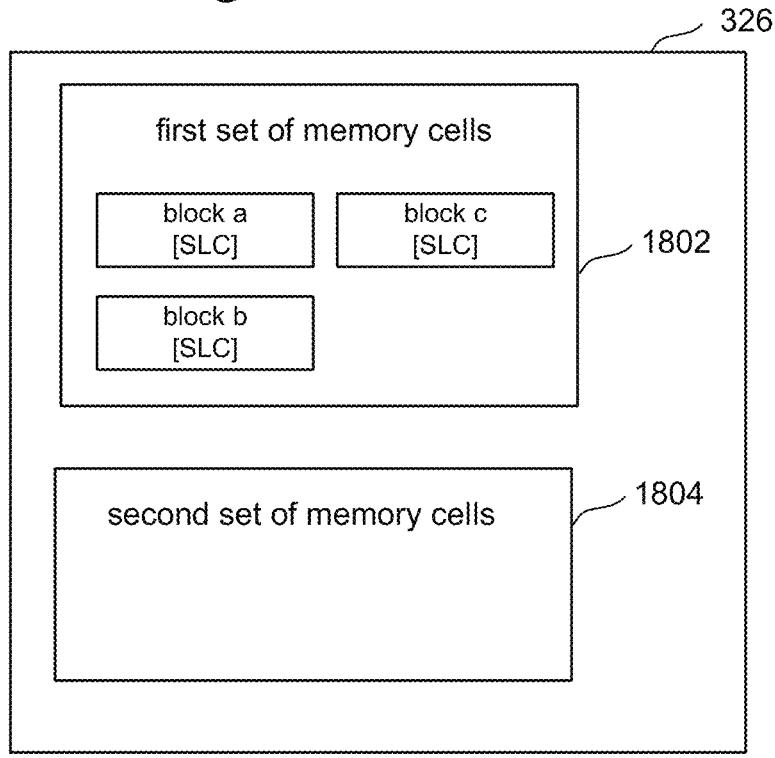
FIGS. 27A and 27B depicts a portion of a memory structure before and after an on-chip-copy operation.
Figure 27B:
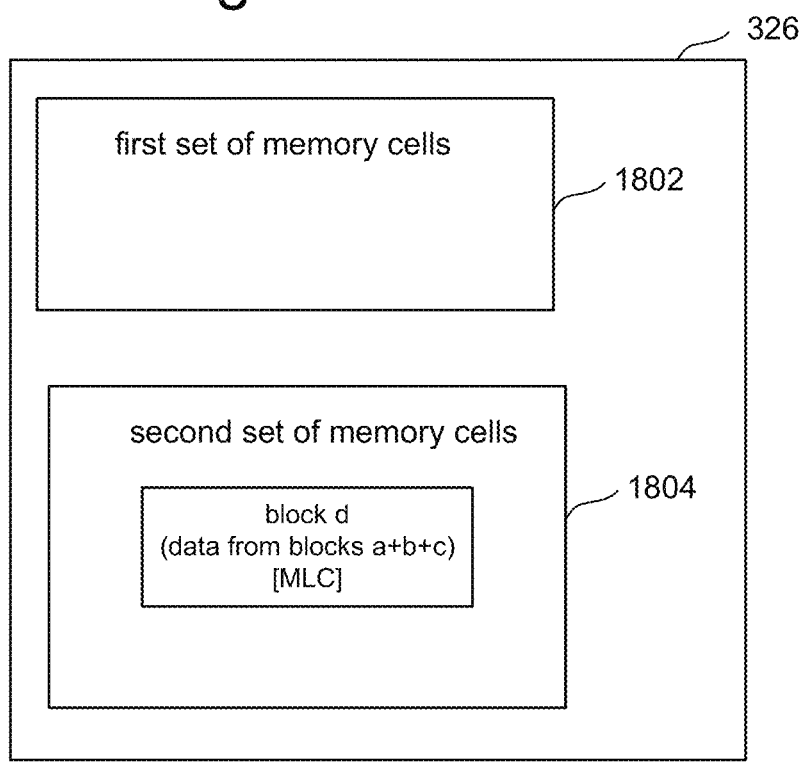

FIG. 27A depicts a portion of memory structure 326 before an on-chip-copy operation and FIG. 27B depicts the portion of memory structure 326 after the on-chip-copy operation for another embodiment of the on-chip-copy operation. That is, for one embodiment, FIG. 27A depicts memory structure 326 before the process of FIG. 25 and FIG. 27B depicts memory structure 326 after the process of FIG. 25. FIGS. 27A and 27B show memory structure 326 including the first set of non-volatile memory cells 1802 and the second set of non-volatile memory cells 1804. In the embodiment of FIGS. 27A/27B, prior to performing the process of FIG. 25, the first set of non-volatile memory cells 1802 store data in three blocks (block a, block b and block c) as single bit per memory cell (SLC) data. In this embodiment, the request to perform an on-chip-copy received in step 1702 from memory controller 102 is a block level command to perform the on-chip-copy from three source blocks (block a, block b and block c) to one target/destination block. The command from memory controller 102 would include addresses for the three source blocks and the one target/destination block. In one set of embodiments, each of blocks a, b and c store multiple codewords; for example, each word line of each block (or each page of each block) can store one or multiple codewords. In one embodiment, each block stores one codeword.

FIG. 27B depicts the portion of memory structure 326 after the on-chip-copy operation (after the process of FIG. 25). During step 1704 of FIG. 24, control die 304 would have read the data in block a, block b and block c. During step 1714 of FIG. 25, control die 304 would have combined the three blocks of single bit per memory cell data from block a, block b and block c (that is stored in latches 360) into one block of multiple bit per memory cell data and stored that data as multiple bit per memory cell data in block d, which comprises the second set of memory cells 1804. Thus, each memory cell of block d stores three bits of data: one bit that originated from block a, one bit that originated from block b and one bit that originated from block c. Thus, the programming of the codewords to the memory die as multiple bit per memory cell data can be performed such that the second set of memory cells 1804 store data from multiple codewords (e.g., a code word from block a, a codeword from block b and a codeword from block c). Step 1714 of FIG. 25 can include performing the programming processes of FIGS. 19 A/B or FIGS. 20A-20I.

Note that FIG. 27B shows the first set of non-volatile memory cells 1802 as being empty. In some embodiments, the first set of non-volatile memory cells 1802 are marked as having invalid data. In other embodiments, the first set of non-volatile memory cells 1802 are erased. In yet other embodiments, the first set of non-volatile memory cells 1802 would still store the original date before corrections.

In one set of embodiments, the one or more control die 304 are configured to program multiple codewords of the on-chip-copy operation to the second set of non-volatile memory cells using a multi-pass programming process such as the processes of FIGS. 19A/B or FIGS. 20A-20I. In one example embodiment of using a multi-pass programming process (e.g., the process of FIGS. 20A-20I), a first subset of the multiple codewords are programmed to the second set of non-volatile memory cells 1804 during a first pass of the multi-pass programming process and a second subset of the multiple codewords are programmed to the second set of non-volatile memory cells 1804 during a later pass of the multi-pass programming process that is subsequent to the first pass such that the one or more control die 304 are configured to perform the decoding process for the second subset of the multiple codewords while programming the first subset of the multiple codewords to the second set of non-volatile memory cells during the first pass of the multi-pass programming process. This process is described by the flow chart of FIG. 28.

Figure 28:
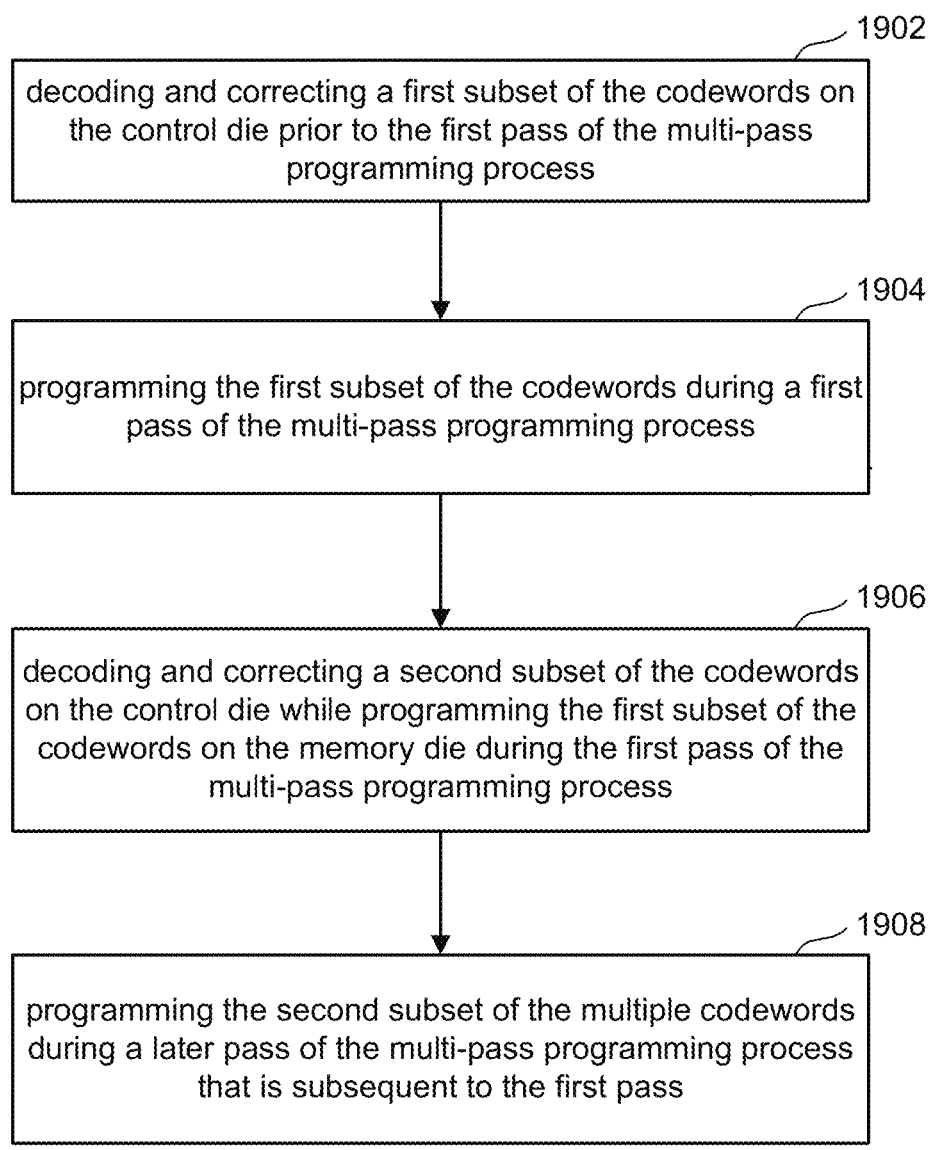
FIG. 28 is a flowchart describing one embodiment of a process for performing an on-chip-copy operation using a multi-pass programming process.

FIG. 28 is a flowchart describing one embodiment of a process for performing an on-chip-copy operation using a multi-pass programming process. The process of FIG. 28 is performed by one or more control die 304, and represents one example implementation of the processes of FIGS. 20A-20I (or a similar process) in combination with the process of FIG. 25 (or a similar process). In step 1902 of FIG. 28, one or more control die 304 decode and correct a first subset of the codewords on the control die 304 prior to the first pass of the multi-pass programming process. In one example, the codewords are from multiple blocks and are stored as single bit per memory cell, and the on-chip-copy operation will combine the date from the multiple codewords in different blocks to form multiple bit per memory cell data. In one example, the first subset of the codewords represent one page of data. Step 1902 of FIG. 28 represents an example implementation of steps 1708-1712 of FIG. 25, and is performed after reading and transferring the first subset of codewords. Step 1902 is also performed after the memory controller requests on on-chip-copy (after, for example, steps 1602 and 1702) that includes the data on the memory die be combined from single bit per memory cell to multiple bit per memory cell and programmed to the memory die.

In step 1904 of FIG. 28, the one or more control die 304 program the first subset of the codewords during a first pass of the multi-pass programming process. Step 1904 represents an example implementation of step 1714 of FIG. 25, performed for the first subset of the codewords of the total set of codewords being subjected to the on-chip-copy. In one embodiment, step 1904 comprises programming either the first pass or the second pass of the programming process of FIGS. 20A-20I. The first pass of the programming process of FIGS. 20A-20I is depicted in FIG. 20A. The second pass of the programming process of FIGS. 20A-20I is depicted in FIG. 20C.

In step 1906 of FIG. 28, the one or more control die 304 decode and correct a second subset of the codewords on the one or more control die 304 while programming the first subset of the codewords on the memory die during the first pass of the multi-pass programming process. In one example, the second subset of the codewords represent one page of data (a different page of data than the first subset of the codewords). Step 1906 of FIG. 28 represent an example implementation of steps 1708-1712 of FIG. 25, and is performed after reading and transferring the second subset of codewords. In one embodiment, step 1906 is performed concurrently with performing step 1904. Decoding for one pass while programming for another pass reduces the time needed to perform the on-chip-copy.

In step 1908 of FIG. 28, the one or more control die 304 program the second subset of the multiple codewords during a later pass of the multi-pass programming process that is subsequent to the first pass. Step 1908 represents an example implementation of step 1714 of FIG. 25, performed for the second subset of the codewords of the total set of codewords being subjected to the on-chip-copy. In one embodiment, step 1908 comprises programming either the second pass or the third pass of the programming process of FIGS. 20A-20I. Step 1908 comprises the second pass of the programming process of FIGS. 20A-20I if step 1904 comprises the first pass of the programming process of FIGS. 20A-20I. Step 1908 comprises the third pass of the programming process of FIGS. 20A-20I if step 1904 comprises the second pass of the programming process of FIGS. 20A-20I. The third pass of the programming process of FIGS. 20A-20I is depicted in FIGS. 20E-H.

Three bits of data and the programming process of FIGS. 20A-20I were only used as an example, and not to limit the process of FIG. 28. The process of FIG. 28 can be used to implement a programming process with two passes, three passes, or more than three passes. The process of FIG. 28 can be used to implement a programming process for memory cells storing three bits of data, less than three bits of data and more than three bits of data. In one embodiment, the processes performed by the one or more control die 304 are performed by the one or more control circuits on the one or more control die 304.

In another example embodiment of using a multi-pass programming process (e.g., the process of FIGS. 19A/B), the multi-pass programming process has (at least) a first pass (e.g., FIG. 19A) and a second pass (e.g., FIG. 19B) such that the one or more control circuits of the control die are configured to program a first set of one or more codewords to a target set of non-volatile memory cells during the first pass of the multi-pass programming process (e.g., FIG. 19A) and the one or more control circuits are configured to program the first set of one or more codewords to the target set of non-volatile memory cells during the second pass of the multi-pass programming process (e.g., FIG. 19B). Thus, the same data is programmed during both passes of the multi-pass programming process.

In some embodiments, the on-chip-copy process (whether on a block level command or a different level of granularity) is for data stored on multiple word lines. In a subset of such embodiments, while the one or more control circuits of the control die are programming data (codewords) from a first word line the one or more control circuits of the control die are concurrently decoding, identifying errors and correcting data (codewords) from a second (next) word line. The control die will program the data (codewords) from the second (next) word line after completing the programming of the data (codewords) from a first word line. For example, steps 1704-1714 of FIG. 25 can be performed for a first codeword on a first word line and steps 1704-1714 of FIG. 25 can be performed for a second codeword on a second word line such that steps 1708-1712 are performed for the second codeword while step 1714 is performed for the first codeword. In another example, steps 1704-1714 of FIG. 25 can be performed for a first codeword on a first portion of a word line and steps 1704-1714 of FIG. 25 can be performed for a second codeword on a second portion of the same word line such that steps 1708-1712 are performed for the second codeword while step 1714 is performed for the first codeword.

In another set of embodiments, the programming process of FIGS. 19A/B can be performed in a manner that interleaves word lines. For example, the process of FIG. 19A can be performed for a first word line, followed by the process of FIG. 19A being performed for a second word line that is next to the first word line, followed by the process of FIG. 19B being performed for the first word line, followed by the process of FIG. 19A being performed for a third word line that is next to the second word line, followed by the process of FIG. 19B being performed for the second word line, etc. In this case, while the process of FIG. 19A is being performed for the first word line (e.g., as part of step 1714 of FIG. 25), steps 1708-1712 are performed for the data to be copied to the second word line.

In an alternative embodiment, the control die 304 can use the on-chip bit error estimate BER (e.g. based on the Syndrome Weight=number of unsatisfied parity check equations, computed by the Syndrome Calculation unit 370 of FIG. 5) in order to make a decision by the control die whether to attempt to perform on-chip decoding and on-chip copy (in case of low BER estimation) or to transfer the codeword to the memory controller for off-chip decoding and copy through the controller (in case of high BER). For example, a first codeword may be found to have a low bit error estimate so that the process of FIG. 25 will be performed for that first codeword, while a second codeword may be found to have a high bit error estimate so that the one or more control circuits on the control die will read the second codeword from the source non-volatile memory cells, store the second codeword read on the control die, determine an estimate of errors in the second codeword on the control die, determine that the estimate of errors is greater than a threshold (performed on the control die) and transfer the second codeword to the memory controller for decoding in response to determining that the estimate of errors is greater than a threshold.

An on-chip-copy process has been described that copies data from a first location on the memory die to a second location on the memory die without transferring the data to the memory controller. Avoiding the transfer to the memory controller increases the speed of operation for the on-chip-copy process and reduces power usage.

One embodiment includes an apparatus comprising a first set of one or more semiconductor dies and a second set of one or more semiconductor dies. In one example, the first set of one or more semiconductor dies are memory dies and the second set of one or more semiconductor dies are control dies, such that each control die is bonded to one or more memory dies (see e.g., FIGS. 8, 9, 11, 12, 14 and 15). The first set of one or more semiconductor dies comprise a first semiconductor die that includes non-volatile memory cells and a first plurality of pathways. The second set of one or more semiconductor dies comprise a second semiconductor die that includes one or more control circuits, an interface to an off die circuit and a second plurality of pathways. The one or more control circuits are configured to transfer signals through pathway pairs of the first plurality of pathways and the second plurality of pathways. Each semiconductor die of the first set of one or more semiconductor dies is directly bonded to a respective semiconductor die of the second set of one or more semiconductor dies. The one or more control circuits on the second semiconductor die are configured to: receive a request to copy data on the first semiconductor die, the request is received from the off die circuit via the interface to the off die circuit, read a first codeword from a first set of non-volatile memory cells on the first semiconductor die in response to the request, store the first codeword read on the second semiconductor die, on the second semiconductor die, perform a decoding process for the first codeword, on the second semiconductor die, identify one or more errors in the first codeword, on the second semiconductor die, correct one or more identified errors in the first codeword, and after correcting the one or more identified errors in the first codeword, program the first codeword to a second set of non-volatile memory cells in the first set of one or more semiconductor dies, the second set of non-volatile memory cells are different than the first set of non-volatile memory cells.

In example implementation, the second set of non-volatile memory cells are on the same die (or dies) as the first set of non-volatile memory cells. In another example implementation, the second set of non-volatile memory cells are on one or more different die as the first set of non-volatile memory cells; for example, by using a control die bonded to multiple memory die (e.g., see FIGS. 9 and 15) or by communicating data between control die bonded to different memory die (e.g., see FIGS. 11 and 12, and corresponding discussion above).

In one example implementation, the first semiconductor die is directly bonded to the second semiconductor die (e.g., via bond pads) and the second set of non-volatile memory cells are on the first semiconductor die.

In one example implementation, the first set of one or more semiconductor dies further comprises a third semiconductor die that includes non-volatile memory cells; the third semiconductor die is bonded to a semiconductor die of the second set of one or more semiconductor dies; and the second set of non-volatile memory cells are on the third semiconductor die.

In one example implementation, the first codeword is stored in the first set of non-volatile memory cells as single bit per memory cell data and the first codeword is stored in the second set of non-volatile memory cells as multiple bit per memory cell data.

In one example implementation, the one or more control circuits on the second semiconductor die are configured to: read multiple codewords from the first semiconductor die in response to the request, the multiple codewords are stored in the first set of non-volatile memory cells as single bit per memory cell data, the multiple codewords include the first codeword; store the multiple codewords read on the second semiconductor die; on the second semiconductor die, perform the decoding process for the multiple codewords; on the second semiconductor die, identify one or more errors in the multiple codewords; on the second semiconductor die, correct one or more identified errors in the multiple codewords; and after correcting the one or more identified errors in the multiple codewords, program the multiple codewords to the second set of non-volatile memory cells on the first semiconductor die as multiple bit per memory cell data such that multiple memory cells of the second set of non-volatile memory cells stores data from the multiple codewords.

In one example implementation (see e.g. FIG. 28), the one or more control circuits are configured to program the multiple codewords to the second set of non-volatile memory cells using a multi-pass programming process; a first subset of the multiple codewords are programmed to the second set of non-volatile memory cells during a first pass of the multi-pass programming process; a second subset of the multiple codewords are programmed to the second set of non-volatile memory cells during a later pass of the multi-pass programming process that is subsequent to the first pass; and the one or more control circuits are configured to perform the decoding process for the second subset of the multiple codewords while programming the first subset of the multiple codewords to the second set of non-volatile memory cells during the first pass of the multi-pass programming process.

In one example implementation, the first semiconductor die includes a non-volatile memory array, the second semiconductor die includes sense amplifiers for reading data from the non-volatile memory array on the first semiconductor die, the non-volatile memory array includes word lines, the second semiconductor die includes address decoders for the non-volatile memory array on the first semiconductor die, and the second semiconductor die includes signal generators configured to generate voltages applied to the word lines of the non-volatile memory array on the first semiconductor die.

In one example implementation, the first codeword comprises data bits and parity bits and the one or more control circuits are configured to read the first codeword from the first set of non-volatile memory cells by reading each data bit and parity bit of the first codeword via a different pathway pair of the plurality of pathways.

One embodiment includes a process, comprising: transferring codewords that are stored in non-volatile memory cells on a memory die to a control die bonded to the memory die, the codewords are stored in the non-volatile memory cells on the memory die as single bit per memory cell data; on the control die, decoding the transferred codewords to identify one or more errors; on the control die, fixing the identified errors in the codewords; and programming the codewords to the memory die as multiple bit per memory cell data such that multiple non-volatile memory cells of the memory die store data from multiple codewords.

One embodiment includes an apparatus, comprising a memory controller configured to decode codewords using a first decoding technique and an integrated memory assembly in communication with the memory controller. The integrated memory assembly comprises a memory die comprising non-volatile memory cells and a control die bonded to the memory die with bond pads. The memory controller is configured to request that data on the memory die be combined from single bit per memory cell to multiple bit per memory cell and programmed to the memory die. The control die is configured to read multiple codewords from the memory die in response to the request. The multiple codewords are stored in the memory die as single bit per memory cell data. The control die is configured to, on the control die, perform a second decoding technique for the multiple codewords. The first decoding technique decodes codewords at a first resolution. The second decoding technique decodes codewords at a second resolution that is lower than the first resolution. The second decoding technique uses lower power than the first decoding technique. The control die is configured to, on the control die, correct one or more errors in the multiple codewords identified during the performing of the second decoding technique for the multiple codewords and, after correcting the one or more errors in the multiple codewords, program the multiple codewords to the memory die as multiple bit per memory cell data such that multiple memory cells store data from multiple codewords.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

For purposed of this document, the terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto

We claim:

1. An apparatus, comprising:
a first set of one or more semiconductor dies comprising a first semiconductor die that includes non-volatile memory cells and a first plurality of pathways; and
a second set of one or more semiconductor dies comprising a second semiconductor die that includes one or more control circuits, an interface to an off die circuit and a second plurality of pathways, the one or more control circuits are configured to transfer signals through pathway pairs of the first plurality of pathways and the second plurality of pathways, each semiconductor die of the first set of one or more semiconductor dies is directly bonded to a respective semiconductor die of the second set of one or more semiconductor dies, the one or more control circuits on the second semiconductor die are configured to:
receive a request to copy data on the first semiconductor die, the request is received from the off die circuit via the interface to the off die circuit,
read a first codeword from a first set of non-volatile memory cells on the first semiconductor die in response to the request,
store the first codeword read on the second semiconductor die,
on the second semiconductor die, perform a decoding process for the first codeword,
on the second semiconductor die, identify one or more errors in the first codeword,
on the second semiconductor die, correct one or more identified errors in the first codeword, and
after correcting the one or more identified errors in the first codeword, program the first codeword to a second set of non-volatile memory cells in the first set of one or more semiconductor dies, the second set of non-volatile memory cells are different than the first set of non-volatile memory cells.

2. The apparatus of claim 1, wherein:
the first codeword is stored in the first set of non-volatile memory cells as single bit per memory cell data; and
the first codeword is stored in the second set of non-volatile memory cells as multiple bit per memory cell data.

3. The apparatus of claim 1, wherein the one or more control circuits on the second semiconductor die are configured to:
read multiple codewords from the first semiconductor die in response to the request, the multiple codewords are stored in the first set of non-volatile memory cells as single bit per memory cell data, the multiple codewords include the first codeword;
store the multiple codewords read on the second semiconductor die;
on the second semiconductor die, perform the decoding process for the multiple codewords;
on the second semiconductor die, identify one or more errors in the multiple codewords;
on the second semiconductor die, correct one or more identified errors in the multiple codewords; and
after correcting the one or more identified errors in the multiple codewords, program the multiple codewords to the second set of non-volatile memory cells as multiple bit per memory cell data such that multiple memory cells of the second set of non-volatile memory cells stores data from the multiple codewords.

4. The apparatus of claim 3, wherein:
the one or more control circuits are configured to program the multiple codewords to the second set of non-volatile memory cells using a multi-pass programming process;
a first subset of the multiple codewords are programmed to the second set of non-volatile memory cells during a first pass of the multi-pass programming process;
a second subset of the multiple codewords are programmed to the second set of non-volatile memory cells during a later pass of the multi-pass programming process that is subsequent to the first pass; and
the one or more control circuits are configured to perform the decoding process for the second subset of the multiple codewords while programming the first subset of the multiple codewords to the second set of non-volatile memory cells during the first pass of the multi-pass programming process.

5. The apparatus of claim 1, wherein:
the first semiconductor die is directly bonded to the second semiconductor die; and
the second set of non-volatile memory cells are on the first semiconductor die.

6. The apparatus of claim 1, wherein:
the first semiconductor die includes a non-volatile memory array; and
the second semiconductor die includes sense amplifiers for reading data from the non-volatile memory array on the first semiconductor die.

7. The apparatus of claim 6, wherein:
the non-volatile memory array includes word lines;
the second semiconductor die includes address decoders for the non-volatile memory array on the first semiconductor die; and
the second semiconductor die includes signal generators configured to generate voltages applied to the word lines of the non-volatile memory array on the first semiconductor die.

8. The apparatus of claim 1, wherein:
the first codeword comprises data bits and parity bits; and
the one or more control circuits are configured to read the first codeword from the first set of non-volatile memory cells by reading each data bit and parity bit of the first codeword via a different pathway pair of the plurality of pathways.

9. The apparatus of claim 1, wherein:
each of the multiple codewords comprises data bits and parity bits; and the one or more control circuits are configured to correct one or more identified errors in the multiple codewords by changing the data bits or the parity bits, without removing the parity bits and without performing an encoding process.

10. The apparatus of claim 1, further comprising:
a memory controller separate from the first semiconductor die and the second semiconductor die, the memory controller is the off die circuit, the memory controller is connected to the second semiconductor die by a communication channel, the memory controller is configured to decode codewords at a first resolution, the one or more control circuits on the second semiconductor die are configured to decode codewords at a second resolution that is lower than the first resolution.

11. The apparatus of claim 10, wherein:
the one or more control circuits on the second semiconductor die are configured to receive the request to copy data from the memory controller via the communication channel;
the one or more control circuits on the second semiconductor die are configured to receive new data to program into non-volatile memory cells on the first semiconductor die from the memory controller via the communication channel;
the one or more control circuits on the second semiconductor die are configured to send other data read from non-volatile memory cells on the first semiconductor die to the memory controller via the communication channel; and
the one or more control circuits on the second semiconductor die are configured to read the first codeword from a first set of non-volatile memory cells, store the first codeword read on the second semiconductor die, perform the decoding process for the first codeword, identify one or more errors in the first codeword, correct one or more identified errors in the first codeword and program the first codeword without transferring the first codeword to the memory controller.

12. The apparatus of claim 10, wherein the one or more control circuits on the second semiconductor die are configured to:
read a second codeword from a third set of non-volatile memory cells of the first set of one or more semiconductor dies;
store the second codeword read on the second semiconductor die;
on the second semiconductor die, determine an estimate of errors in the second codeword;
on the second semiconductor die, determine that the estimate of errors is greater than a threshold; and
transfer the second codeword to the memory controller for decoding in response to determining that the estimate of errors is greater than a threshold.

13. The apparatus of claim 10, wherein:
the one or more control circuits are configured to transmit the first codeword to the memory controller via the communication channel if the one or more control circuits cannot successfully decode the first codeword; and in response to receiving the first codeword via the communication channel, the memory controller is configured to decode the first codeword at the second resolution, fix errors in the first codeword and return the first codeword to the second semiconductor die via the communication channel for the one or more control circuits to program the first codeword to the first semiconductor die.

14. The apparatus of claim 1, wherein:
the request identifies a source block on the first semiconductor die and a destination block on the first semiconductor die, the first set of non-volatile memory cells are in the source block, the second set of non-volatile memory cells are in the destination block.

15. The apparatus of claim 1, wherein:
the one or more control circuits are configured to program the first codeword to the second set of non-volatile memory cells using a multi-pass programming process;
the multi-pass programming process includes a first pass and a second pass;
the one or more control circuits are configured to program the first codeword to the second set of non-volatile memory cells during the first pass of the multi-pass programming process; and
the one or more control circuits are configured to program the first codeword to the second set of non-volatile memory cells during the second pass of the multi-pass programming process.

16. The apparatus of claim 1, wherein the one or more control circuits on the second semiconductor die are configured to:
read a second codeword from a third set of non-volatile memory cells of the first set of one or more semiconductor dies;
store the second codeword read on the second semiconductor die;
on the second semiconductor die, perform a decoding process for the second codeword while the one or more control circuits program the first codeword to the second set of non-volatile memory cells;
on the second semiconductor die, identify one or more errors in the second codeword;
on the second semiconductor die, correct one or more identified errors in the second codeword; and
after correcting the one or more identified errors in the second codeword, program the second codeword to a fourth set of non-volatile memory cells of the first set of one or more semiconductor dies, the fourth set of non-volatile memory cells are different than the third set of non-volatile memory cells.

17. The apparatus of claim 1, wherein:
the first set of one or more semiconductor dies further comprises a third semiconductor die that includes non-volatile memory cells;
the third semiconductor die is bonded to a semiconductor die of the second set of one or more semiconductor dies; and
the second set of non-volatile memory cells are on the third semiconductor die.

* * * * *